(12) United States Patent
Park

(10) Patent No.: US 11,908,533 B2
(45) Date of Patent: Feb. 20, 2024

(54) MEMORY DEVICE DETECTING LEAKAGE CURRENT AND OPERATION METHOD THEREOF

(71) Applicant: Samsung Electronics Co., Ltd., Suwon-si (KR)

(72) Inventor: Hyunkook Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 121 days.

(21) Appl. No.: 17/727,762

(22) Filed: Apr. 24, 2022

(65) Prior Publication Data
US 2022/0415420 A1     Dec. 29, 2022

(30) Foreign Application Priority Data
Jun. 29, 2021    (KR) ........................ 10-2021-0084799

(51) Int. Cl.
*G11C 16/00*       (2006.01)
*G11C 16/34*       (2006.01)
(Continued)

(52) U.S. Cl.
CPC .......... *G11C 16/3459* (2013.01); *G11C 16/08* (2013.01); *G11C 16/102* (2013.01); *G11C 16/26* (2013.01); *G11C 16/32* (2013.01)

(58) Field of Classification Search
CPC .............. G11C 11/221; G11C 11/2259; G11C 11/2273; G11C 11/4091; G11C 16/26; G11C 11/2255; G11C 16/30; G11C 2029/1202; G11C 29/025; G11C 29/028; G11C 16/10; G11C 16/3404; G11C 16/3459; G11C 11/2275; G11C 11/406; G11C 11/40615; G11C 2029/5006; G11C 29/04; G11C 8/08; G11C 13/0004; G11C 13/003; G11C 13/0069; G11C 2013/0045; G11C 2013/0076; G11C 2013/0078; G11C 2029/0409; G11C 2213/35;
(Continued)

(56) References Cited

U.S. PATENT DOCUMENTS 7,532,513 B2    5/2009    Chen et al.
8,432,732 B2    4/2013    Li et al.
(Continued)

FOREIGN PATENT DOCUMENTS

CN         104835533 A      8/2015

*Primary Examiner* — Thong Q Le
(74) *Attorney, Agent, or Firm* — Muir Patent Law, PLLC

(57) ABSTRACT

Disclosed is an operation method of a memory device which includes floating a first driving line corresponding to a first word line from the first word line and precharging the first driving line with a first voltage, floating the first driving line from the first voltage to sense a first voltage variation of the first driving line, storing the first voltage variation in a first capacitor, electrically connecting the first driving line to the first word line and precharging the first driving line and the first word line with the first voltage, floating the first driving line and the first word line from the first voltage to sense a second voltage variation of the first driving line and the first word line, and outputting a first detection signal corresponding to a first leakage current through the first word line based on the first voltage variation and the second voltage variation.

20 Claims, 24 Drawing Sheets

(51) Int. Cl.
*G11C 16/08* (2006.01)
*G11C 16/32* (2006.01)
*G11C 16/26* (2006.01)
*G11C 16/10* (2006.01)

(58) Field of Classification Search
CPC .............. G11C 2213/76; G11C 29/021; G11C 29/50016; G11C 29/52; G11C 16/0483; G11C 16/08; G11C 16/102; G11C 16/20; G11C 16/32; G11C 16/3436; G11C 16/344; G11C 16/3445; G11C 2029/0411; G11C 2029/5004; G11C 29/18; G11C 29/4401; G11C 29/50; G11C 29/76; G11C 7/16; G11C 11/40611; G11C 11/40622; G11C 11/4096; G11C 16/24; G11C 2029/0403; G11C 2029/5002; G11C 2211/4068; G11C 29/024; G11C 29/12005; G11C 7/1063; G11C 8/10

USPC ............................................ 365/149, 185.21
See application file for complete search history.

(56) References Cited

U.S. PATENT DOCUMENTS

| | | |
|---|---|---|
| 8,432,737 B2 | 4/2013 | Shiga |
| 8,514,630 B2 | 8/2013 | Huynh et al. |
| 8,693,254 B2 | 4/2014 | Hashimoto |
| 9,105,357 B2 | 8/2015 | Namai et al. |
| 9,704,542 B2 | 7/2017 | Yamada |
| 10,008,276 B2 | 6/2018 | Huynh et al. |
| 2016/0018453 A1 | 1/2016 | Jeon et al. |
| 2016/0018454 A1 | 1/2016 | Jeon et al. |
| 2020/0395059 A1* | 12/2020 | Visconti ................ G11C 11/221 |

\* cited by examiner

MEMORY DEVICE DETECTING LEAKAGE CURRENT AND OPERATION METHOD THEREOF

CROSS-REFERENCE TO RELATED APPLICATION(S)

This application claims priority under 35 U.S.C. § 119 to Korean Patent Application No. 10-2021-0084799 filed on Jun. 29, 2021, in the Korean Intellectual Property Office, the disclosure of which is incorporated by reference herein in its entirety.

BACKGROUND

Embodiments of the inventive concept disclosed herein relate to a semiconductor memory, and more particularly, relate to a memory device configured to detect a leakage current and an operation method thereof.

Semiconductor memory devices are classified as volatile memory devices, in which stored data disappear when a power supply is turned off, such as a static random access memory (SRAM) or a dynamic random access memory (DRAM), or nonvolatile memory devices, in which stored data are retained even when a power supply is turned off, such as a flash memory device, a phase-change RAM (PRAM), a magnetic RAM (MRAM), a resistive RAM (RRAM), or a ferroelectric RAM (FRAM).

A flash memory device is being widely used as a high-capacity storage medium in a computing device. Nowadays, as the degree of integration of the flash memory device is improved, a distance between memory cells included in the flash memory device may decrease, thereby causing various leakage currents between memory cells or internal elements. The reliability of operation of the flash memory device may be reduced due to the leakage current. Accordingly, there is a need to detect a leakage current accurately.

SUMMARY

Embodiments of the present disclosure provide a memory device configured to detect a leakage current with improved reliability by detecting a leakage current accurately for each of word lines of the memory device and an operation method thereof.

According to an embodiment, an operation method of a memory device including a leakage detecting circuit and a row decoder configured to control a voltage of a first word line through a first driving line includes floating the first driving line from the first word line and precharging the first driving line with a first voltage, floating the first driving line from the first voltage to sense a first voltage variation of the first driving line, storing the first voltage variation in a first capacitor of the leakage detecting circuit, electrically connecting the first driving line to the first word line and precharging the first driving line and the first word line with the first voltage, floating the first driving line and the first word line from the first voltage to sense a second voltage variation of the first driving line and the first word line, and outputting, by the leakage detecting circuit, a first detection signal corresponding to a first leakage current through the first word line based on the first voltage variation stored in the first capacitor and the second voltage variation.

According to an embodiment, a memory device includes a first memory block that is connected to a first word line, a row decoder that controls a voltage of the first word line through a first driving line, and a leakage detecting circuit that outputs a first detection signal by detecting a first leakage current through the first driving line during a first time interval, storing a first voltage corresponding to the first leakage current during a second time interval, detecting a second leakage current through the first driving line other than the first word line during a third time interval, and detecting a third leakage current through the first word line based on the first voltage and the second leakage current.

According to an embodiment, an operation method of a memory device including a plurality of memory blocks and a leakage detecting circuit configured to detect a leakage current includes precharging a first current path with a first voltage, floating the first current path from the first voltage to detect a first voltage variation corresponding to a first leakage current on the first current path, storing the first voltage variation in a first capacitor of the leakage detecting circuit, precharging the first current path and a second current path with the first voltage, floating the first current path and the second current path from the first voltage to detect a second voltage variation corresponding to a sum of the first leakage current on the first current path and a second leakage current on the second current path, and outputting, by the leakage detecting circuit, a first detection signal corresponding to the second leakage current based on the first voltage variation stored in the first capacitor and the second voltage variation. The leakage current includes the first leakage current and the second leakage current.

BRIEF DESCRIPTION OF THE FIGURES

The above and other objects and features of the present disclosure will become apparent by describing in detail embodiments thereof with reference to the accompanying drawings.

DETAILED DESCRIPTION

Below, example embodiments of the present disclosure may be described in detail and clearly to such an extent that an ordinary one in the art easily implements the invention.

Figure 1:
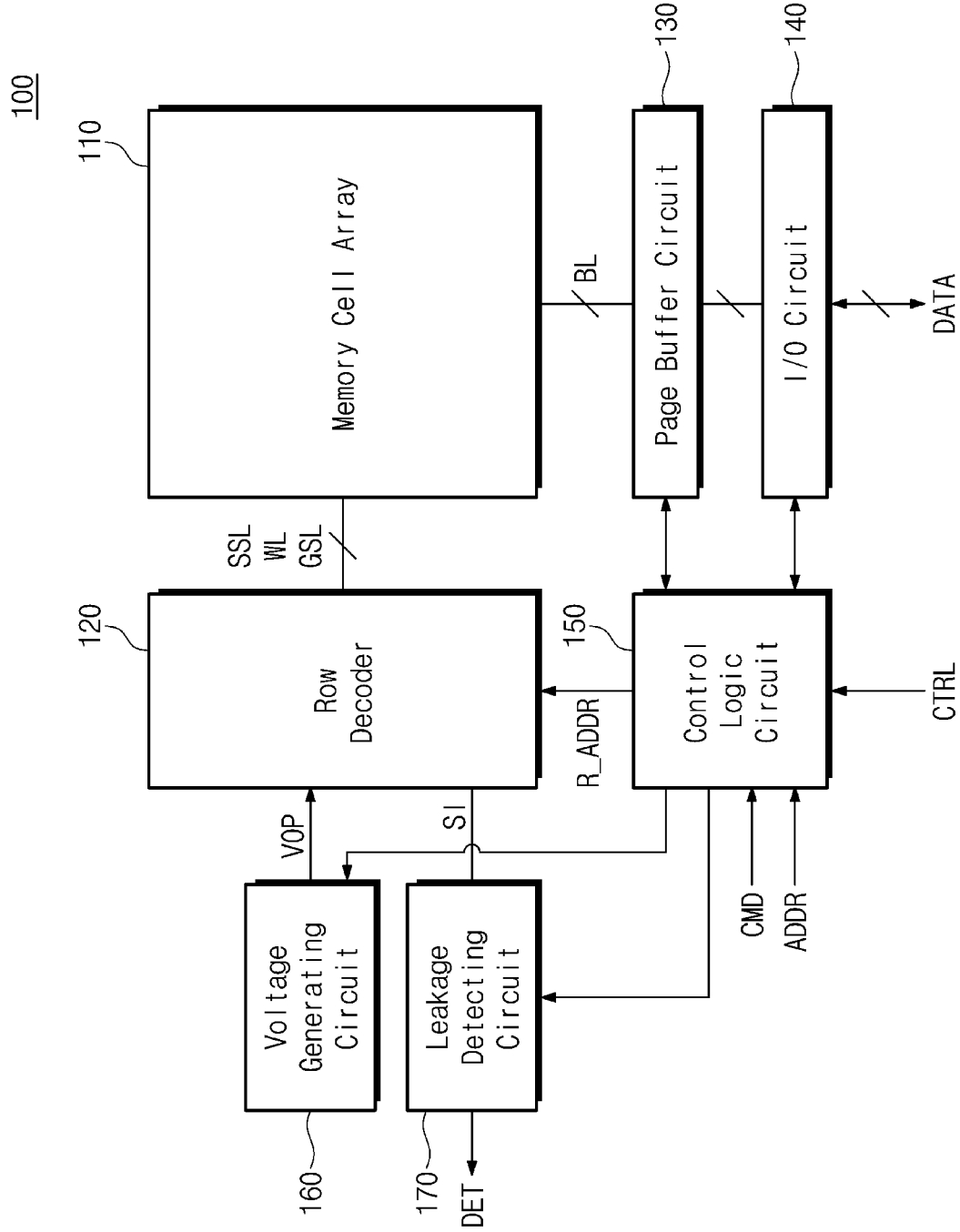
FIG. 1 is a block diagram illustrating a memory device according to an embodiment of the present disclosure.

FIG. 1 is a block diagram illustrating a memory device according to an embodiment of the present disclosure. Referring to FIG. 1, a memory device 100 may include a memory cell array 110, a row decoder 120, a page buffer circuit 130, an input/output circuit 140, a control logic circuit 150, a voltage generating circuit 160, and a leakage detecting circuit 170. In an embodiment, the memory device 100 may be a nonvolatile memory device such as a NAND flash memory device, but the present disclosure is not limited thereto.

The memory cell array 110 may include a plurality of memory blocks. Each of the plurality of memory blocks may be connected to string selection lines SSL, word lines WL, ground selection lines GSL, and bit lines BL. A configuration of the plurality of memory blocks will be described in more detail with reference to FIG. 2.

The row decoder 120 may receive a row address R_ADDR from the control logic circuit 150. The row decoder 120 may decode the row address R_ADDR and may control voltages of the string selection lines SSL, the word lines WL, and the ground selection lines GSL based on a decoding result. For example, the row decoder 120 may receive various operation voltages VOP from the voltage generating circuit 160 and may provide a corresponding various operation voltage VOP to each of the string selection lines SSL, the word lines WL, and the ground selection lines GSL based on the decoded result.

The page buffer circuit 130 may be connected to the memory cell array 110 through the bit lines BL. The page buffer circuit 130 may receive data "DATA" from the input/output circuit 140 and may temporarily store the received data "DATA". The page buffer circuit 130 may control voltages of the bit lines BL such that the temporary stored data "DATA" are stored in the memory cell array 110. Alternatively, the page buffer circuit 130 may read the data "DATA" stored in the memory cell array 110 by sensing changes in voltages of the bit lines BL. The page buffer circuit 130 may provide the read data "DATA" to the input/output circuit 140.

The input/output circuit 140 may exchange the data "DATA" with the external device (e.g., a memory controller). In an embodiment, in response to a data strobe signal, the input/output circuit 140 may output the data "DATA" to the external device or may receive the data "DATA" from the external device.

The control logic circuit 150 may receive an address ADDR, a command CMD and a control signal CTRL from the external device (e.g., a memory controller). The control logic circuit 150 may control various components of the memory device 100 based on the received the address ADDR, the command CMD and the control signals CTRL. For example, the control logic circuit 150 may provide the row address R_ADDR to the row decoder 120, and a column address C_ADDR to the input/output circuit 140.

The voltage generating circuit 160 may generate the various operation voltages VOP necessary for the memory device 100 to operate. For example, the various operation voltages VOP may include a plurality of program voltages, a plurality of pass voltages, a plurality of selection read voltages, a plurality of non-selection read voltages, a plurality of erase voltages, and the like. In an embodiment, the various operation voltage VOP may include a sensing voltage that is used to detect a leakage current of the memory cell array 110. The sensing voltage may be a pass voltage, but the present disclosure is not limited thereto.

The leakage detecting circuit 170 may be configured to detect various leakage currents occurring in the memory device 100 and to output a detection signal DET based on a detection result. The control logic circuit 150 may determine whether to detect a leakage current based on the detection signal DET from the leakage detecting circuit 170 or may send information corresponding to the detection signal DET to the external device (e.g., a memory controller). For example, the leakage detecting circuit 170 may output the detection signal DET when the leakage detecting circuit 170 detects a predetermined magnitude of the leakage current.

In an embodiment, the leakage detecting circuit 170 may be configured to detect a leakage current of each of the word lines WL connected to the memory cell array 110. For example, the leakage detecting circuit 170 may be connected to the row decoder 120 through driving lines SI. The driving lines SI may be respectively connected to the string selection lines SSL, the word lines WL, and the ground selection lines GSL and may be configured to provide corresponding driving voltages to the lines SSL, WL, and GSL. A configuration of the driving lines SI will be described in more detail with reference to FIG. 3.

The leakage detecting circuit 170 may detect a first leakage current of at least one of the driving lines SI and may store information about the first leakage current in a specific element (e.g., a capacitor). Afterwards, the leakage detecting circuit 170 may detect a second leakage current of at least one of the driving lines SI and at least one word line WL corresponding to the at least one driving line. The leakage detecting circuit 170 may be configured to detect a leakage current of the at least one word line WL based on the information stored in the specific element and the second leakage current thus detected. In this case, there may be detected only a leakage current of a word line except for leakage currents of the driving lines SI or various other elements. This may mean that a leakage current of a word line is accurately detected. In an embodiment, a configuration and an operation of the leakage detecting circuit 170 will be described in more detail with reference to the following drawings.

In an embodiment, an operation of the leakage detecting circuit 170 may be performed in the process of testing the memory device 100. Alternatively, the operation of the leakage detecting circuit 170 may be performed under control of the external device during a normal operation of the memory device 100.

Figure 2:
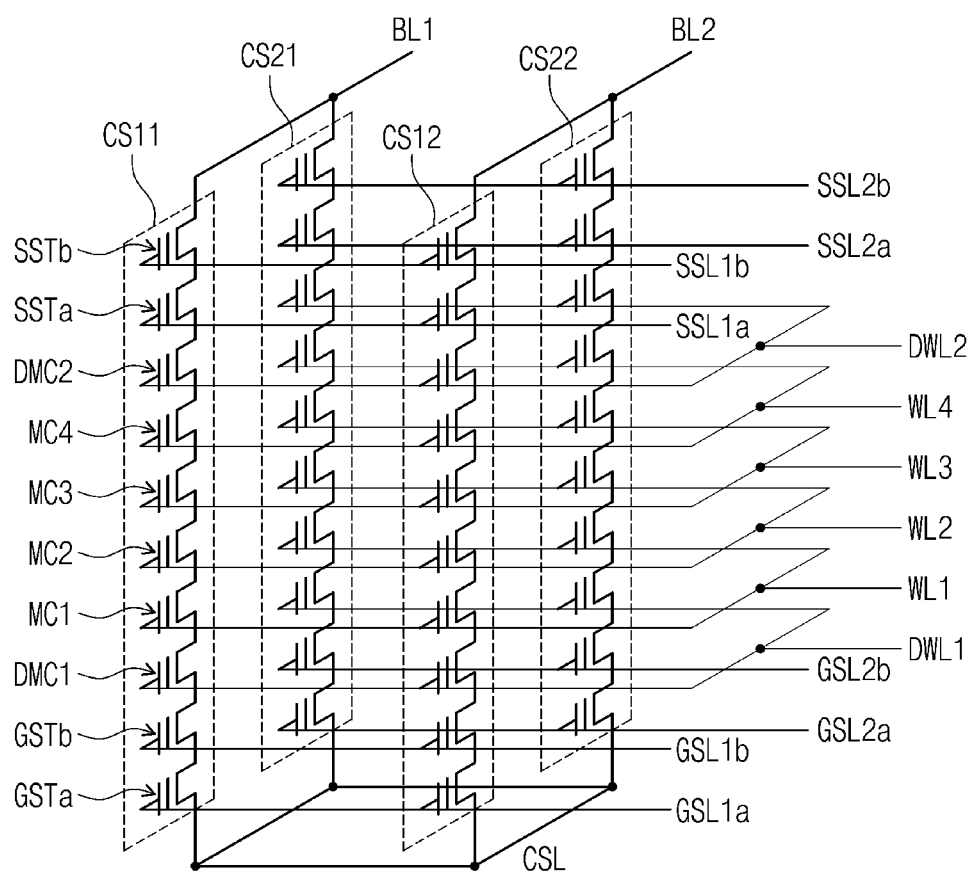
FIG. 2 is a diagram illustrating a first memory block of a plurality of memory blocks included in a memory cell array in FIG. 1 according to example embodiments.
Figure 2:
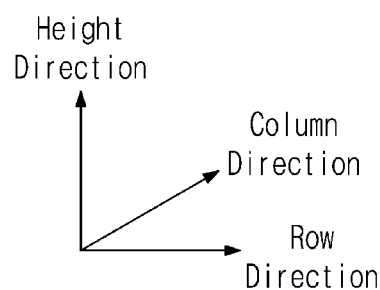

FIG. 2 is a diagram illustrating a first memory block of a plurality of memory blocks included in a memory cell array in FIG. 1 according to example embodiments. A first memory block BLK1 will be described with reference to FIG. 2. However, it may be understood that the remaining memory blocks included in the memory cell array 110 have a structure similar to that of the first memory block BLK1.

Referring to FIGS. 1 and 2, the first memory block BLK1 may include a plurality of cell strings CS11, CS12, CS21, and CS22. The plurality of cell strings CS11, CS12, CS21, and CS22 may be arranged in a row direction and a column direction.

Cell strings placed at the same column from among the plurality of cell strings CS11, CS12, CS21, and CS22 may be connected to the same bit line. For example, the cell strings CS11 and CS21 may be connected to a first bit line BL1, and the cell strings CS12 and CS22 may be connected to a second bit line BL2. Each of the plurality of cell strings CS11, CS12, CS21, and CS22 may include a plurality of cell transistors. Each of the plurality of cell transistors may include a charge trap flash (CTF) memory cell, but the present disclosure is not limited thereto. The plurality of cell transistors may be stacked in a height direction that is a direction perpendicular to a plane (e.g., a semiconductor substrate (not illustrated)) defined by the row direction and the column direction.

The plurality of cell transistors of each cell string may be connected in series between the corresponding bit line (e.g., BL1 or BL2) and the common source line CSL. For example, the plurality of cell transistors may include string selection transistors SSTa and SSTb, dummy memory cells DMC1 and DMC2, memory cells MC1 to MC4, and ground selection transistors GSTa and GSTb. The string selection transistors SSTa and SSTb that are connected in series may be provided or connected between the serially-connected memory cells MC1 to MC4 and the corresponding bit line (e.g., BL1 and BL2). The ground selection transistors GSTa and GSTb that are connected in series may be provided or connected between the serially-connected memory cells MC1 to MC4 and the common source line CSL. In an embodiment, the second dummy memory cell DMC2 may be provided between the serially-connected string selection transistors SSTa and SSTb and the serially-connected memory cells MC1 to MC4, and the first dummy memory cell DMC1 may be provided between the serially-connected memory cells MC1 to MC4 and the serially-connected ground selection transistors GSTa and GSTb.

Memory cells placed at the same height from among the memory cells MC1 to MC4 of the plurality of cell strings CS11, CS12, CS21, and CS22 may share the same word line. For example, the first memory cells MC1 of the plurality of cell strings CS11, CS12, CS21, and CS22 may be placed at the same height from the semiconductor substrate (not illustrated) and may share the first word line WL1. The second memory cells MC2 of the plurality of cell strings CS11, CS12, CS21, and CS22 may be placed at the same height from the semiconductor substrate (not illustrated) and may share the second word line WL2. Likewise, the third memory cells MC3 of the plurality of cell strings CS11, CS12, CS21, and CS22 may be placed at the same height from the semiconductor substrate (not illustrated) and may share the third word line WL3, and the fourth memory cells MC4 of the plurality of cell strings CS11, CS12, CS21, and CS22 may be placed at the same height from the semiconductor substrate (not illustrated) and may share the fourth word line WL4.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may share a string selection line SSL1*b*, and the string selection transistors SSTa of the cell strings CS11 and CS12 may share a string selection line SSL1*a*. The string selection transistors SSTb of the cell strings CS21 and CS22 may be connected to a string selection line SSL2*b*, and the string selection transistors SSTa of the cell strings CS21 and CS22 may be connected to a string selection line SSL2*a*.

Although not illustrated in FIG. 2, string selection transistors placed at the same row from among the string selection transistors SSTa and SSTb of the plurality of cell strings CS11, CS12, CS21, and CS22 may share the same string selection line. For example, the string selection transistors SSTb and SSTa of the cell strings CS11 and CS12 may share a first string selection line, and the string selection transistors SSTb and SSTa of the cell strings CS21 and CS22 may share a second string selection line different from the first string selection line.

Ground selection transistors placed at the same height and the same row from among the ground selection transistors GSTa and GSTb of the plurality of cell strings CS11, CS12, CS21, and CS22 may be connected to the same ground selection line. For example, the ground selection transistors GSTb of the cell strings CS11 and CS12 may be connected to a first ground selection line GSL1*b*, and the ground selection transistors GSTa of the cell strings CS11 and CS12 may share a second ground selection line GSL1*a*. The ground selection transistors GSTb of the cell strings CS21 and CS22 may be connected to a ground selection line GSL2*b*, and the ground selection transistors GSTa of the cell strings CS21 and CS22 may be connected to a ground selection line GSL2*a*.

Although not illustrated in FIG. 2, the ground selection transistors GSTb and GSTa of the plurality of cell strings CS11, CS12, CS21, and CS22 may share the same ground selection line. Alternatively, ground selection transistors placed at the same height from among the ground selection transistors GSTb and GSTa of the plurality of cell strings CS11, CS12, CS21, and CS22 may share the same ground selection line. Alternatively, ground selection transistors placed at the same row from among the ground selection transistors GSTb and GSTa of the plurality of cell strings CS11, CS12, CS21, and CS22 may share the same ground selection line.

Although not illustrated in FIG. 2, each of the plurality of cell strings CS11, CS12, CS21, and CS22 of the first memory block BLK1 may further include an erase control transistor (ECT). The erase control transistors of the plurality of cell strings CS11, CS12, CS21, and CS22 may be placed at the same height from the semiconductor substrate and may be connected to the same erase control line. For example, in each of the plurality of cell strings CS11, CS12, CS21, and CS22, the erase control transistor may be interposed between the ground selection transistor GSTa and the common source line CSL. Alternatively, the erase control transistor may be interposed between the corresponding bit line BL1 or BL2 and the string selection transistor SSTb. However, the present disclosure is not limited thereto.

In an embodiment, the first memory block BLK1 illustrated in FIG. 2 is only an example. The number of cell strings may increase or decrease, and the number of rows of cell strings and the number of columns of cell strings may increase or decrease depending on the number of cell strings. Also, in the first memory block BLK1, the number of cell transistors (i.e., GST, MC, DMC, and SST) of the first memory block BLK1 may increase or decrease, and the height of the first memory block BLK1 may increase or decrease depending on the number of cell transistors. Also, the number of lines (i.e., GSL, WL, DWL, and SSL) connected to cell transistors may increase or decrease depending on the number of cell transistors. In an embodiment, as the number of cell transistors of the first memory block BLK1 increases, the first memory block BLK1 may have a multi-stack structure.

Figure 3:
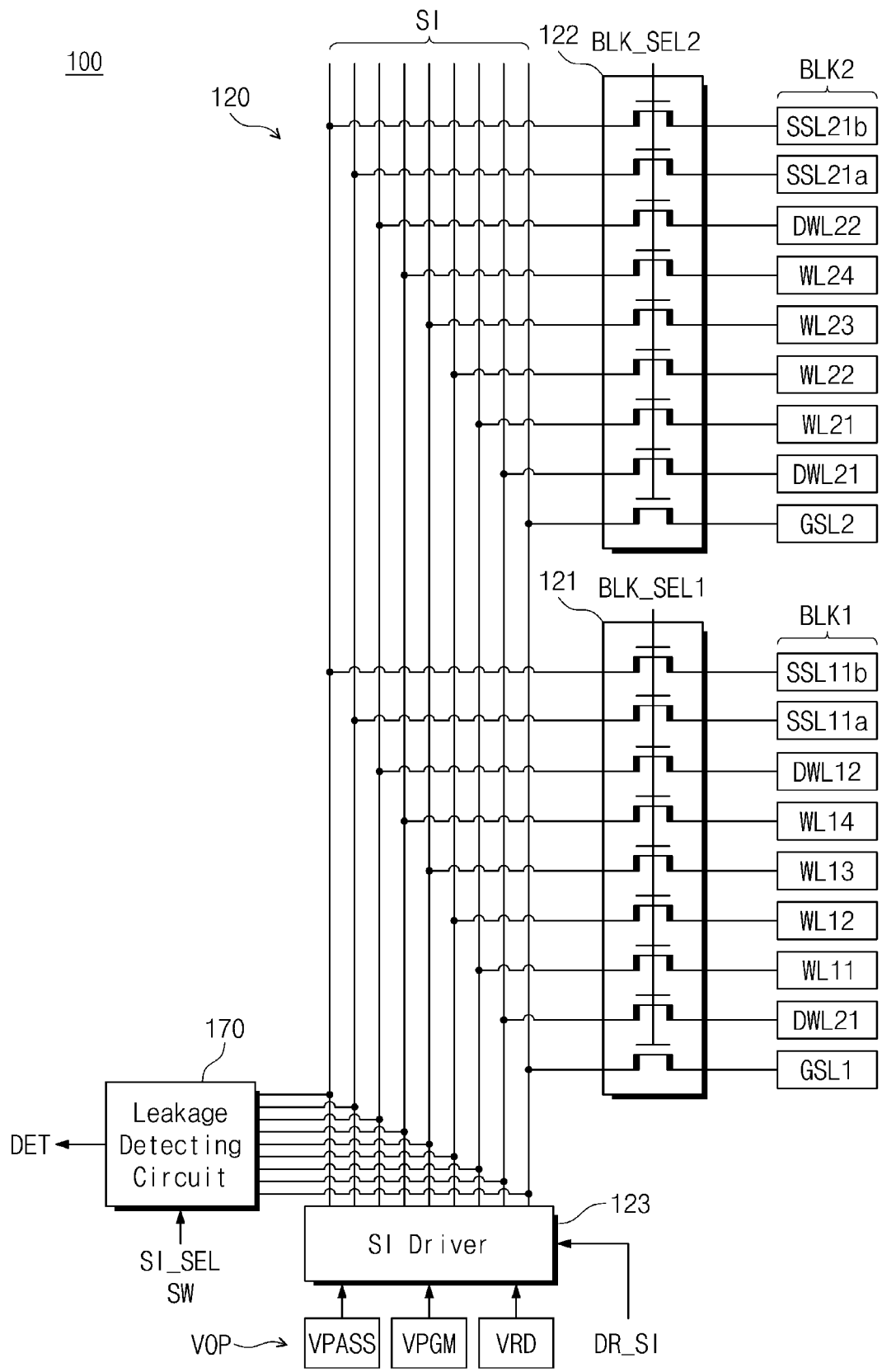
FIG. 3 is a diagram illustrating a memory device of FIG. 1 according to example embodiments.

FIG. 3 is a diagram illustrating a memory device of FIG. 1 according to example embodiments. An operation of the leakage detecting circuit 170 will be described with reference to FIG. 3, and for brevity of drawing and convenience of description, components that are unnecessary to describe the operation of the leakage detecting circuit 170 will be omitted.

Referring to FIGS. 1 and 3, the row decoder 120 may include the plurality of driving lines SI, a first block selecting circuit 121, a second block selecting circuit 122, and a driving line driver 123. The plurality of driving lines SI may be connected to corresponding lines of the first and second memory blocks BLK1 and BLK2 through the first and second block selecting circuits 121 and 122. For example, one of the plurality of driving lines SI may be connected to a 11-th word line WL11 of the first memory block BLK1 through the first block selecting circuit 121, and may be connected to a 21-th word line WL21 of the second memory block BLK2 through the second block selecting circuit 122. For example, depending on operation states of the first and second block selecting circuits 121 and 122, one of the plurality of driving lines SI may be connected to the word line WL11 of the first memory block BLK1 or the word line WL21 of the second memory block BLK2 or may provide a corresponding driving voltage thereto. Functions of the remaining driving lines are similar to that of the one driving line except that lines corresponding to the remaining driving lines are different from each other, and thus, additional description will be omitted to avoid redundancy.

The first block selecting circuit 121 may operate in response to a first block selection signal BLK_SEL1. For example, in response to the first block selection signal BLK_SEL1, the first block selecting circuit 121 may provide driving voltages of the plurality of driving lines SI to the corresponding lines (e.g., GSL1, DWL21, WL11 to WL14, DWL12, SSL11a, and SSL1b) or may block the driving voltages. The first block selecting circuit 121 may include pass switches or pass transistors that are respectively connected between the plurality of driving lines SI and the corresponding lines and are configured to operate in response to the first block selection signal BLK_SEL1.

The second block selecting circuit 122 may operate in response to a second block selection signal BLK_SEL2. A configuration of the second block selecting circuit 122 is similar to that of the first block selecting circuit 121 except that corresponding memory blocks are different, and thus, additional description will be omitted to avoid redundancy.

The driving line driver 123 may provide the various operation voltages VOP to the plurality of driving lines SI in response to a driving line control signal DR_SI. For example, the various operation voltages VOP may include various voltages such as a pass voltage VPASS, a program voltage VPGM, and a read voltage VRD. When there is performed a read operation for the word line WL11 of the first memory block BLK1, the driving line control signal DR_SI may be generated such that the read voltage VRD is applied to a driving line corresponding to the word line WL11 of the first memory block BLK1 from among the plurality of driving lines SI and the pass voltage VPASS (or a non-selection read voltage) is applied to the remaining driving lines.

In this case, the first block selection signal BLK_SEL1 may be activated such that the first memory block BLK1 is selected, and the second block selection signal BLK_SEL2 may be deactivated such that the second memory block BLK2 is not selected. In this case, voltages of the plurality of driving lines SI may be provided to the first memory block BLK1, and the second memory block BLK2 may be in a floating state. As described above, various operations of the memory device 100 may be performed by controlling the plurality of driving lines SI and the block selecting circuits 121 and 122.

The leakage detecting circuit 170 may be configured to detect a leakage current from at least one of the plurality of driving lines SI. For example, the leakage detecting circuit 170 may be connected to the plurality of driving lines SI. The leakage detecting circuit 170 may be configured to select at least one of the plurality of driving lines SI in response to a driving line selection signal SI_SEL. The leakage detecting circuit 170 may detect a leakage current of at least one of the plurality of driving lines SI or at least one word line corresponding to the at least one driving line by performing a leakage detecting operation in response to a switching signal SW, and may output the detection signal DET as a detection result. A configuration and an operation of the leakage detecting circuit 170 will be described in more detail with reference to the following drawings.

Figure 4:
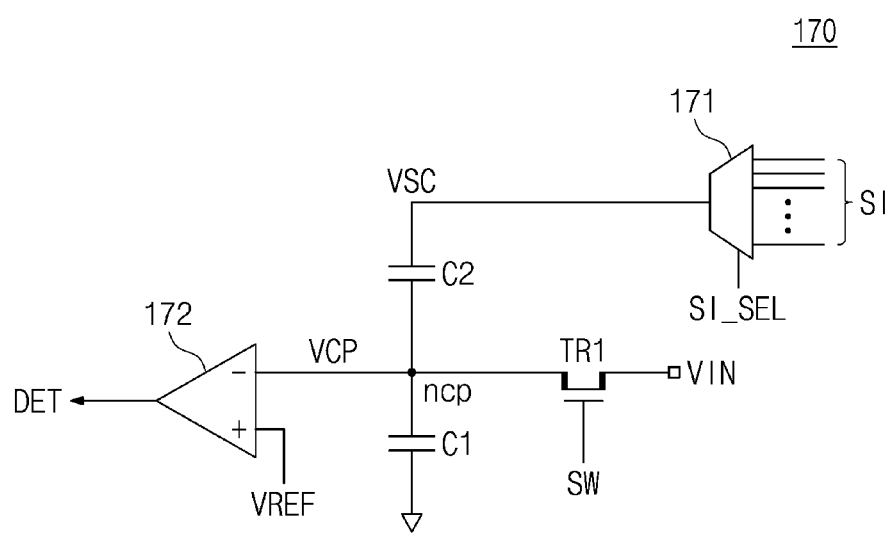
FIG. 4 is a circuit diagram illustrating a leakage detecting circuit of FIG. 3 in detail according to example embodiments.

FIG. 4 is a circuit diagram illustrating a leakage detecting circuit of FIG. 3 in detail according to example embodiments. The leakage detecting circuit 170 of FIG. 4 is only an example, and the present disclosure is not limited thereto. It may be understood that the leakage detecting circuit 170 according to the present disclosure may be implemented with various circuits or function blocks capable of achieving the technical idea of the invention.

Referring to FIGS. 3 and 4, the leakage detecting circuit 170 may include a driving line selector 171, a comparator 172, a first transistor TR1, a first capacitor C1, and a second capacitor C2.

The driving line selector 171 may be configured to select at least one of the plurality of driving lines SI of the row decoder 120 in response to the driving line selection signal SI_SEL. For example, the driving line selection signal SI_SEL may be a signal for selecting a driving line corresponding to a word line targeted for detection of a leakage current. In detail, when a leakage detecting operation is performed with respect to the word line WL11 of the first memory block BLK1, the driving line selection signal SI_SEL may be generated such that a driving line, which is connected to the word line WL11 of the first memory block BLK1, from among the plurality of driving lines SI is selected. In an embodiment, the driving line selection signal SI_SEL may be generated from the control logic circuit 150.

The second capacitor C2 may be connected between an output terminal of the driving line selector 171 and a comparison node ncp. The first capacitor C1 may be connected between the comparison node ncp and a specific node (e.g., a ground node).

The first transistor TR1 may be connected between an input voltage VIN and the comparison node ncp and may be turned on or turned off in response to the switching signal SW.

An inverting input terminal (−) of the comparator 172 may be connected to the comparison node ncp, and a non-inverting input terminal (+) thereof may be connected to a reference voltage VREF. The comparator 172 may compare a voltage VCP (hereinafter referred to as a "comparison voltage") of the comparison node ncp and the reference voltage VREF and may output a comparison result as the detection signal DET. For example, when the comparison voltage VCP is greater than the reference voltage VREF, the detection signal DET may be set to a low level. In this case, it is assumed that the leakage detecting circuit 170 may not output the detection signal DET. When the comparison voltage VCP is not greater than the reference voltage VREF, the detection signal DET may be set to a high level. In this case, it is assumed that the leakage detecting circuit 170 may output the detection signal DET. In an embodiment, that the comparison voltage VCP is greater than the reference voltage VREF may mean that a leakage current is absent from the target word line or a magnitude of the leakage current is smaller than a reference value, and that the comparison voltage VCP is not greater than the reference voltage VREF may mean that a leakage current is present at the target word line or a magnitude of the leakage current is greater than the reference value. A configuration and an operation principle thereof will be described in more detail with reference to the following drawings.

Figure 5:
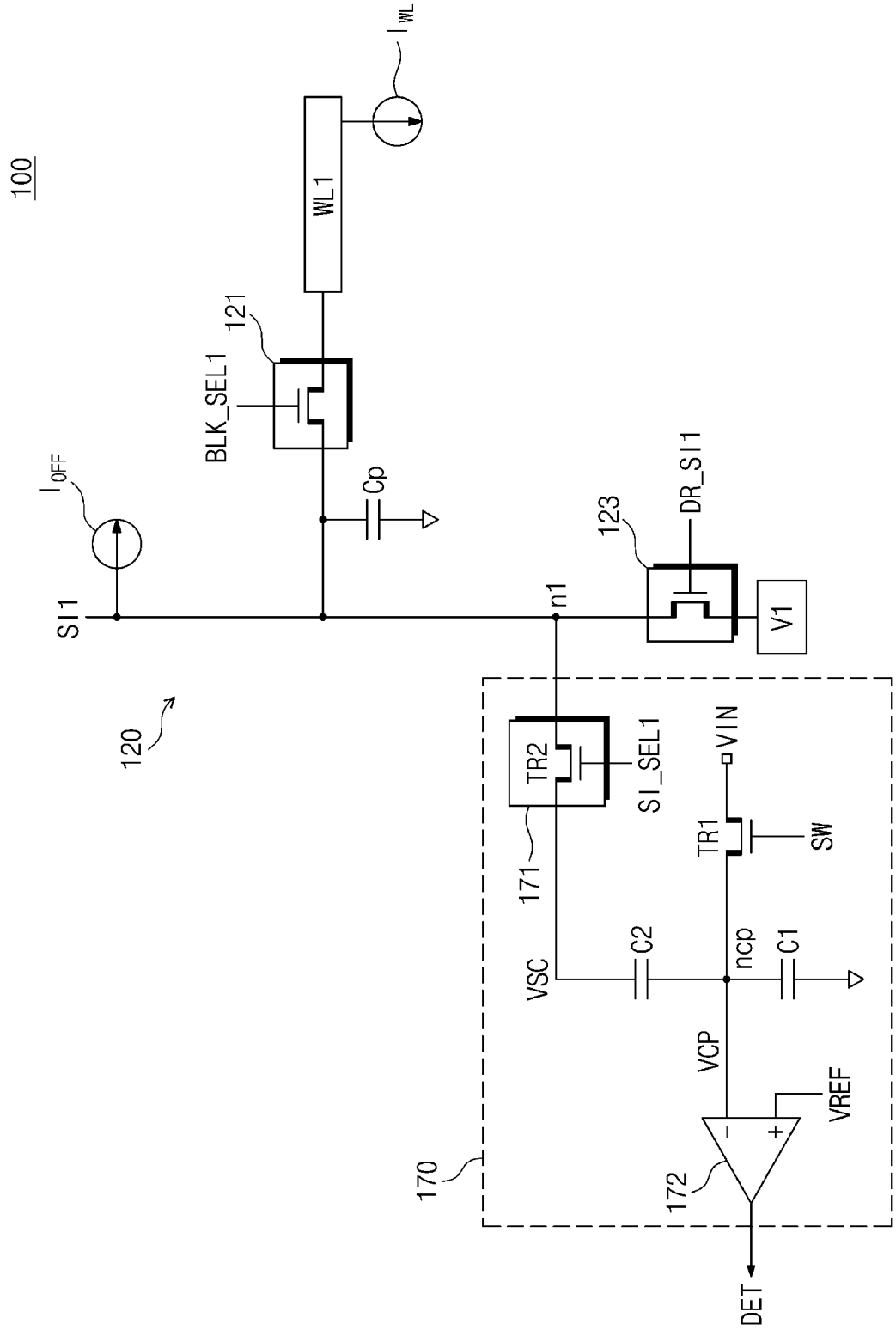
FIG. 5 is a diagram for describing an operation of a leakage detecting circuit of FIG. 4 according to example embodiments.
Figure 6:
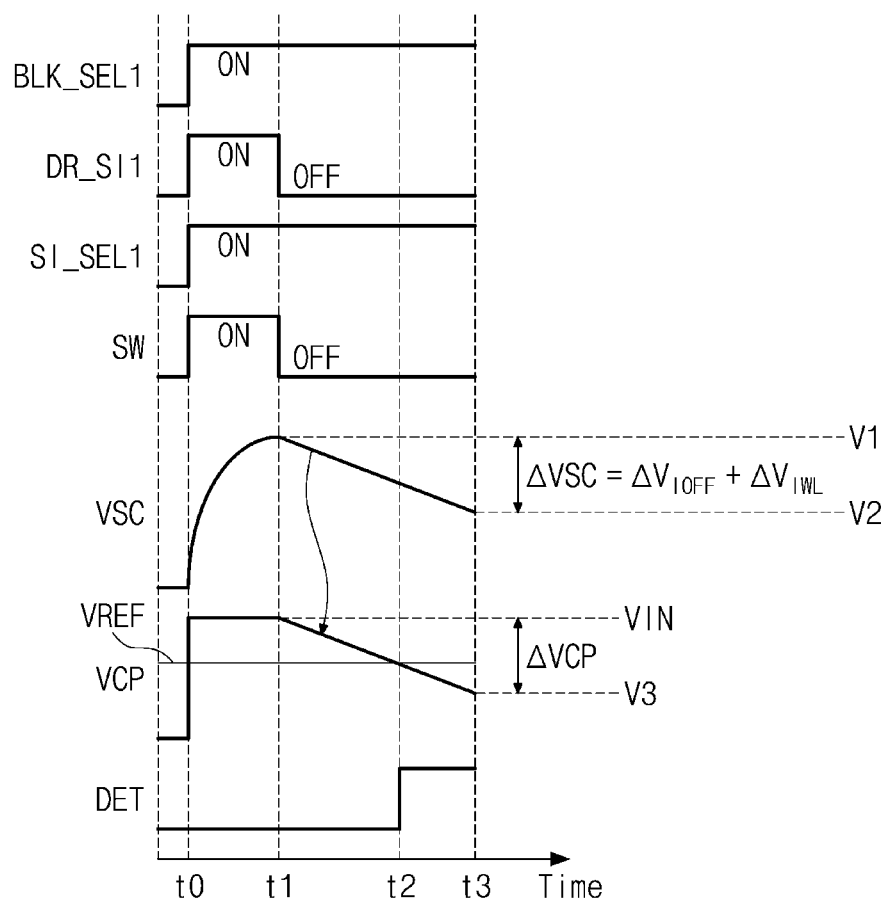
FIG. 6 is a timing diagram illustrating an operation of a leakage detecting circuit of FIG. 5 according to example embodiments.

FIG. 5 is a diagram for describing an operation of a leakage detecting circuit of FIG. 4 according to example embodiments. FIG. 6 is a timing diagram illustrating an operation of a leakage detecting circuit of FIG. 5 according to example embodiments. For brevity of drawing and convenience of description, it is assumed that the leakage detecting circuit 170 detects a leakage current of the first word line WL1. For example, the first word line WL1 may be selected as a target word line, and the leakage detecting circuit 170 may be configured to detect a leakage current of the first word line WL1. In the following drawings, components that are unnecessary to describe an operation in which the leakage detecting circuit 170 detects a leakage current of the first word line WL1 will be omitted. However, the present disclosure is not limited thereto.

Below, the expression "leakage current of a driving line" is used. A leakage current of a driving line may mean a leakage current that occurs at a corresponding driving line. Alternatively, a leakage current of a driving line may include leakage currents coming from various components of any other peripheral circuit(s), as well as the corresponding driving line. The expression is for describing embodiments of the present disclosure simply, and it may be understood that the scope and spirit of the invention is not limited by the expression.

Referring to FIGS. 3 to 6, the row decoder 120 of the memory device 100 may include a first driving line SI1, the first block selecting circuit 121, and the driving line driver 123. The first driving line SI1 may be connected to the first word line WL1 of the first memory block BLK1 through the first block selecting circuit 121. The first block selecting circuit 121 may operate in response to the first block selection signal BLK_SEL1.

The leakage detecting circuit 170 of the memory device 100 may be configured to detect a word line leakage current $I_{WL}$ of the first word line WL1. For example, the leakage detecting circuit 170 may include the driving line selector 171, the comparator 172, the first transistor TR1, a second transistor TR2, the first capacitor C1, and the second capacitor C2. The comparator 172, the first transistor TR1, the first capacitor C1, and the second capacitor C2 are described above, and thus, additional description will be omitted to avoid redundancy. In an embodiment, to describe an operation in which the leakage detecting circuit 170 detects a leakage current of the first word line WL1, the second transistor TR2 for selecting the first driving line SI1 corresponding to the first word line WL1 is illustrated. The second transistor TR2 may operate in response to a first driving line selection signal SI_SEL1 and may be a component included in the driving line selector 171 described with reference to FIG. 4.

The leakage detecting circuit 170 may be connected to the first driving line SI1 corresponding to the first word line WL1 at a first node n1. The leakage detecting circuit 170 may detect the word line leakage current $I_{WL}$ of the first word line WL1 by sensing a changed voltage of the first node n1.

In more detail, as illustrated in FIG. 6, during a time interval from a time point t0 to a time point t1, the first block selection signal BLK_SEL1, a first driving line control signal DR_SI1, the first driving line selection signal SI_SEL1, and the switching signal SW may be maintained at an on-level ON. The on-level ON of each signal may indicate a voltage level enough to turn on a corresponding transistor or switch, and an off-level OFF of each signal may indicate a voltage level enough to turn off the corresponding transistor or switch.

During the time interval from the time point t0 to the time point t1, the driving line driver 123 may provide a first voltage V1 to the first driving line SI1 in response to the first driving line control signal DR_SI1. In an embodiment, the first driving line control signal DR_SI1 may refer to a signal for applying the first voltage V1 to the first driving line SI1. When any other voltage (e.g., a program voltage or a read voltage) is applied to the first driving line SI1, a control signal corresponding to the first driving line SI1 may be changed to any other signal. In an embodiment, the first voltage V1 may be the pass voltage VPASS that is used in a program operation or a read operation. Alternatively, the first voltage V1 may have a given level.

As the first voltage V1 is supplied to the first driving line SI1, the first driving line SI1 and the first word line WL1 may be charged or precharged with the first voltage V1. In this case, because the second transistor TR2 is in a turn-on state, a voltage VSC (hereinafter referred to as a "screen voltage") between the second capacitor C2 and the second transistor TR2 may be equal to the first voltage V1. Also, because the first transistor TR1 is in a turn-on state, the comparison voltage VCP may be equal to the input voltage VIN.

Afterwards, at the time point t1, the first block selection signal BLK_SEL1 and the first driving line selection signal SI_SEL1 may maintain the on-level ON, and the first driving line control signal DR_SI1 and the switching signal SW may change to the off-level OFF. In this case, the first driving line SI1 may be floated (or disconnected) from the driving line driver 123, and the comparison node ncp may be floated (or disconnected) from the input voltage VIN.

As such, a voltage of the first node n1 may decrease due to a leakage current $I_{OFF}$ of the first driving line SI1 and the leakage current $I_{WL}$ of the first word line WL1. As the voltage of the first node n1 decreases, the screen voltage VSC may decrease from the first voltage V1 to a second voltage V2. As the screen voltage VSC decreases, the comparison voltage VCP may decrease from the input voltage VIN to a third voltage V3.

As illustrated in FIG. 6, at a time point t2, the comparison voltage VCP may be smaller than the reference voltage VREF. In this case, the detection signal DET that the comparator 172 outputs may transition to the high level. For example, at the time point t2, the leakage detecting circuit 170 may output the detection signal DET providing notification that a leakage current occurs at the first word line WL1.

In an embodiment, as illustrated in FIG. 6, as the first driving line SI1 and the first word line WL1 are floated, the voltage drop due to the leakage currents $I_{OFF}$ and $I_{WL}$ of the lines SI1 and WL1 may appear as the voltage drop of the comparison voltage VCP. In this case, a voltage drop ΔVSC of the screen voltage VSC may correspond to a sum of a voltage drop $\Delta V_{IWL}$ due to the leakage current of the first driving line SI1 and a voltage drop $\Delta V_{IWL}$ due to the leakage current of the first word line WL1, and a voltage drop ΔVCP of the comparison voltage VCP may correspond to the voltage drop ΔVSC of the screen voltage VSC. In other words, the voltage drop ΔVCP of the comparison voltage VCP may include a voltage drop due to the leakage current $I_{OFF}$ of the first driving line SI1 as well as a voltage drop due to the leakage current $I_{WL}$ of the first word line WL1. Accordingly, the detection signal DET according to the timing diagram of FIG. 6 shows a result to which both the leakage current $I_{WL}$ of the first word line WL1 and the leakage current $I_{OFF}$ of the first driving line SI1 are reflected. In this case, it may be difficult to detect only the leakage current $I_{WL}$ of the first word line WL1.

Figure 7:
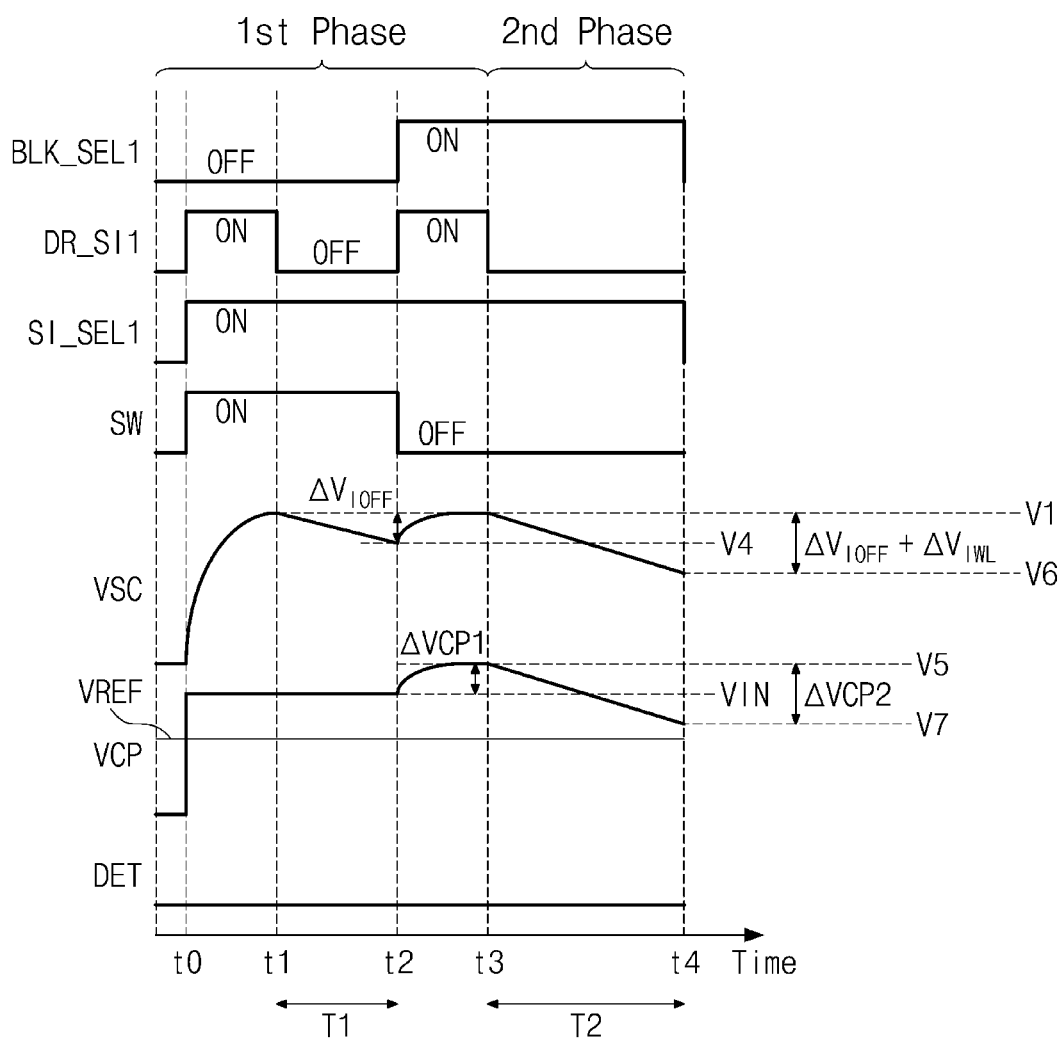
FIG. 7 is a timing diagram illustrating an operation of a leakage detecting circuit of FIG. 5 according to example embodiments.

FIG. 7 is a timing diagram illustrating an operation of a leakage detecting circuit of FIG. 5 according to example embodiments. FIGS. 8A to 8D are diagrams for describing an operation of a leakage detecting circuit according to the timing diagram of FIG. 7. Referring to FIGS. 5, 7, and 8A to 8D, the leakage detecting circuit 170 may detect the leakage current $I_{WL}$ of the first word line WL1 through operations of a first phase and a second phase.

For example, the operation of the first phase may indicate an operation of detecting only the leakage current $I_{OFF}$ of the first driving line SI1 except for the leakage current $I_{WL}$ of the first word line WL1 and storing information about the detected leakage current $I_{OFF}$ in a specific element (e.g., the first capacitor C1). The operation of the second phase may indicate an operation of detecting both the leakage current $I_{WL}$ of the first word line WL1 and the leakage current $I_{OFF}$ of the first driving line SI1 and detecting only the leakage current $I_{WL}$ of the first word line WL1 based on the detected result and the information stored in the specific element.

The first phase may include operations from a time point t0 to a time point t3 (i.e., operations of detecting a leakage current of a driving line (or a sub-path) and storing the detected result), and the second phase may include operations from the time point t3 to a time point t4 (i.e., operations of detecting a leakage current of a driving line and a word line (or a full-path) and canceling out the leakage current).

In more detail, during a time interval from the time point t0 to a time point t1 of FIG. 7, the first block selection signal BLK_SEL1 may be maintained at the off-level OFF, and the first driving line control signal DR_SI1, the first driving line selection signal SI_SEL1, and the switching signal SW may be maintained at the on-level ON.

Figure 8A:
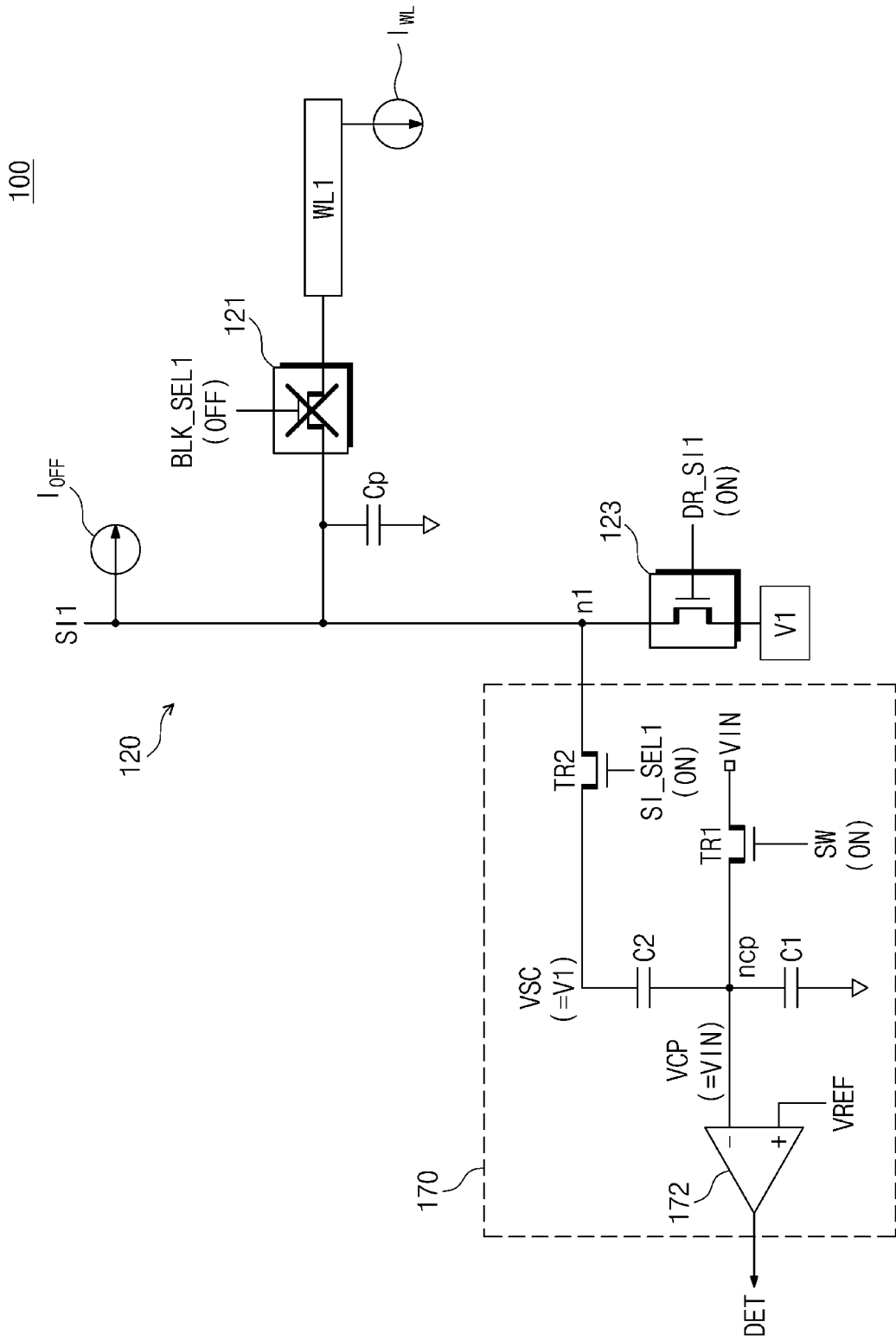
FIGS. 8A to 8D are diagrams for describing an operation of a leakage detecting circuit according to the flowchart of FIG. 7.

In this case, as illustrated in FIG. 8A, the driving line driver 123 may apply the first voltage V1 to the first driving line SI1 in response to the first driving line control signal DR_SI1. The first transistor TR1 may be turned on in response to the switching signal SW, and the second transistor TR2 may be turned on in response to the first driving line selection signal SI_SEL1. The first block selecting circuit 121 may be turned off in response to the first block selection signal BLK_SEL1 having the off-level OFF. In this case, in the time interval from the time point t0 to the time point t1 of FIG. 7, the first driving line SI1 and the screen voltage VSC may be charged or precharged with the first voltage V1, and the comparison voltage VCP may be equal to the input voltage VIN.

Afterwards, during a time interval from the time point t1 to the time point t2 of FIG. 7, the first block selection signal BLK_SEL1 may maintain the off-level OFF, the first driving line control signal DR_SI1 may change to the off-level OFF, and the first driving line selection signal SI_SEL1 and the switching signal SW may maintain the on-level ON.

Figure 8B:
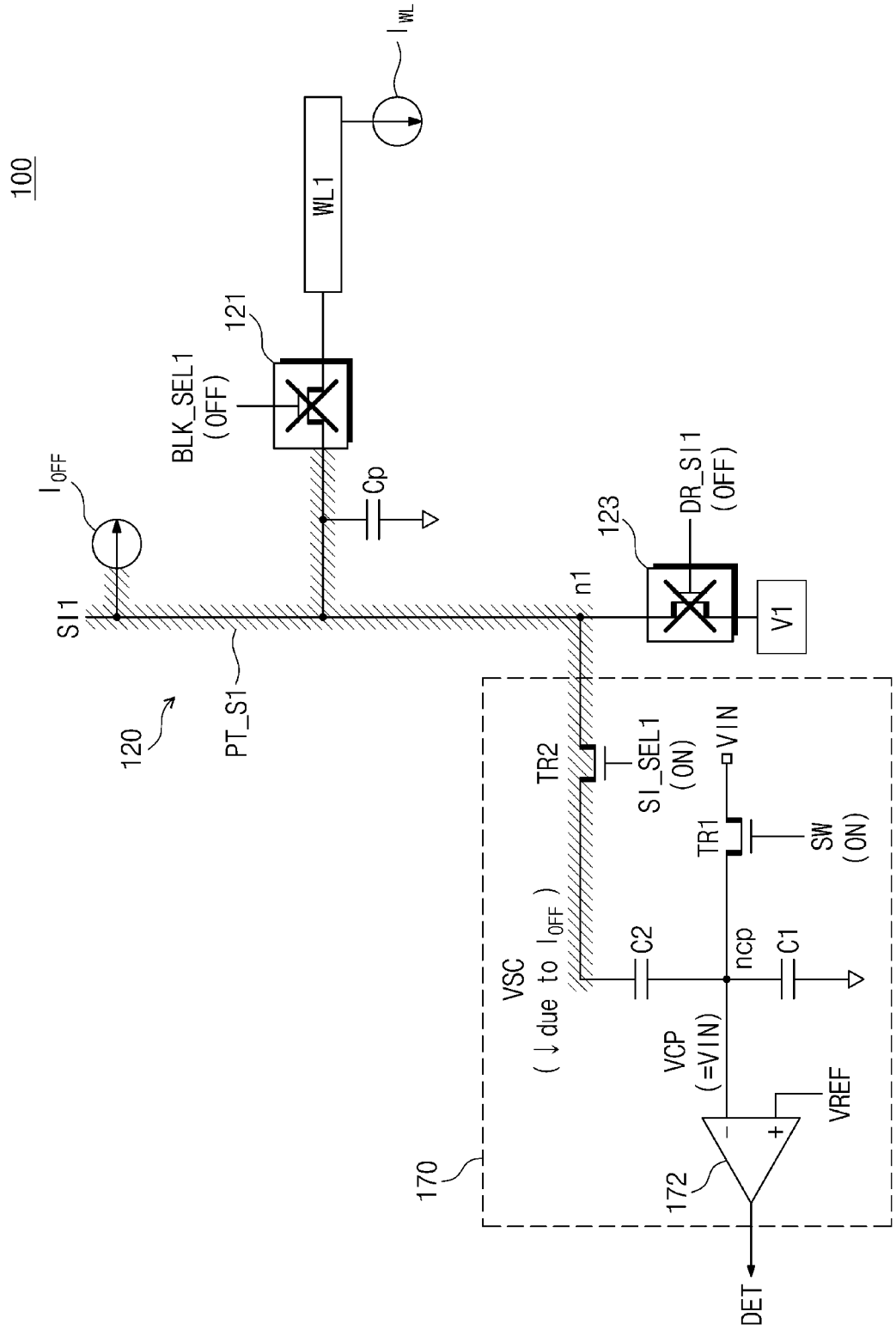

In this case, as illustrated in FIG. 8B, in response to the first driving line control signal DR_SI1 having the off-level OFF, the driving line driver 123 may block the first voltage V1, may be turned off, or may float the first driving line SI1. Operations according to the remaining signals BLK_SEL1, SI_SEL1, and SW are similar to those described with reference to FIG. 8A, and thus, additional description will be omitted to avoid redundancy. In this case, a first sub-path PT_S1 as illustrated in FIG. 8B may be formed. The first sub-path PT_S1 may refer to a current path that includes the first driving line SI1 and does not include the first word line WL1.

Because a voltage is not supplied to the first sub-path PT_S1 or there is no power source connected to the first sub-path PT_S1 (i.e., because the first sub-path PT_S1 is in a floating state), a voltage associated with the first sub-path PT_S1 may decrease due to the leakage current $I_{OFF}$ of the first driving line SI1. As the voltage associated with the first sub-path PT_S1 decreases, the screen voltage VSC may decrease. For example, as illustrated in FIG. 7, the screen voltage VSC may decrease from the first voltage V1 to a fourth voltage V4 as much as $\Delta V_{IOFF}$. For example, the voltage drop of the screen voltage VSC may be the voltage drop $\Delta V_{IOFF}$ due to the leakage current $I_{OFF}$ of the first driving line SI1 or may include information about the leakage current $I_{OFF}$ of the first driving line SI1.

Afterwards, during a time interval from a time point t2 to the time point t3 of FIG. 7, the first block selection signal BLK_SEL1 and the first driving line control signal DR_SI1 may change to the on-level ON, the first driving line selection signal SI_SEL1 may maintain the on-level ON, and the switching signal SW may change to the off-level OFF.

Figure 8C:
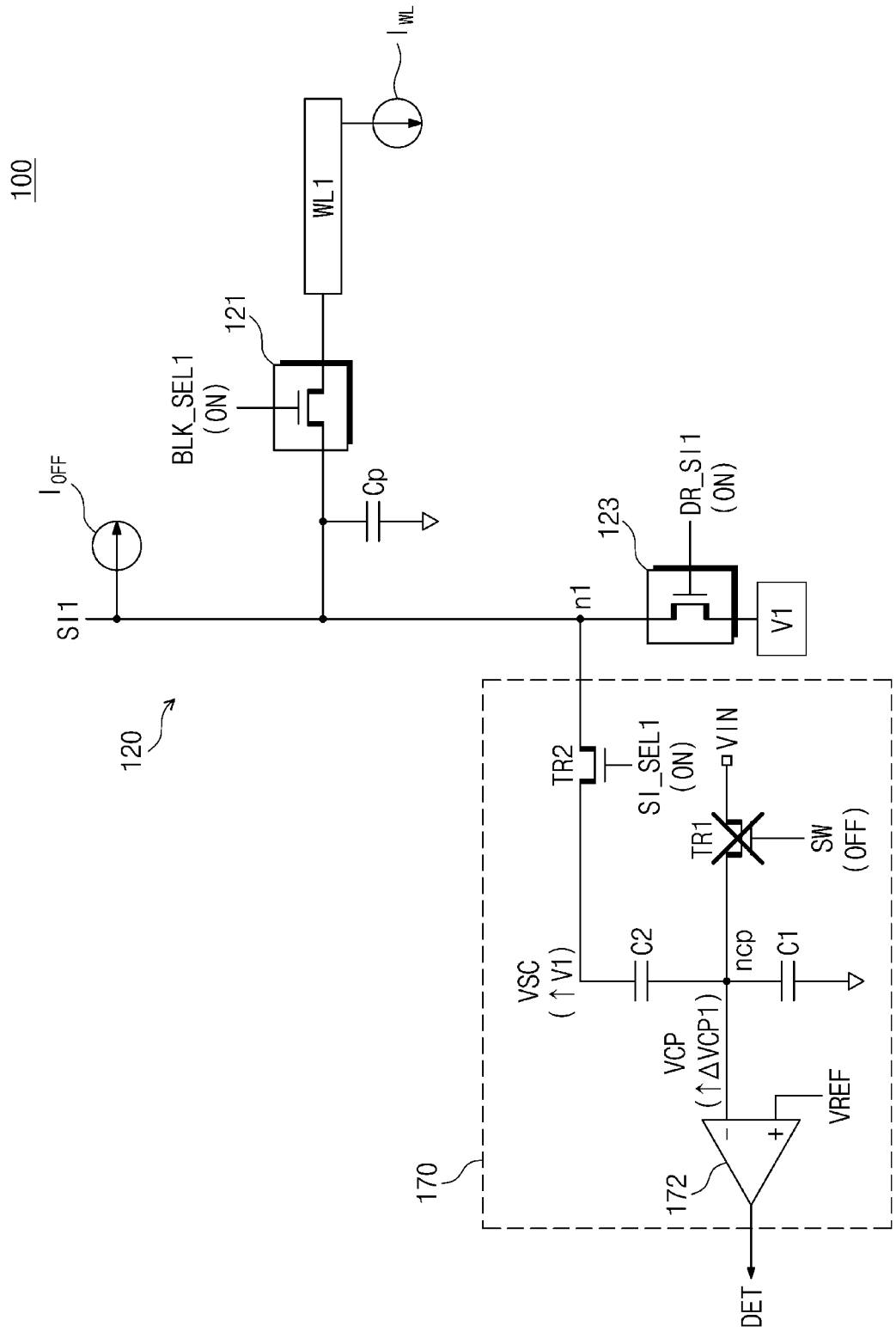

In this case, as illustrated in FIG. 8C, the driving line driver 123 may apply the first voltage V1 to the first driving line SI1 in response to the first driving line control signal DR_SI1 having the on-level ON. The first block selecting circuit 121 may connect the first word line WL1 with the first driving line SI1 in response to the first block selection signal BLK_SEL1 having the on-level ON. The first transistor TR1 may be turned off in response to the switching signal SW having the off-level OFF, and the second transistor TR2 may be turned on in response to the first driving line selection signal SI_SEL1 having the on-level ON.

In this case, during the time interval from the time point t2 to the time point t3 of FIG. 7 or as illustrated in FIG. 8C, the first driving line SI1, the first word line WL1, and the screen voltage VSC may be charged or precharged with the first voltage V1. For example, the screen voltage VSC may increase from the fourth voltage V4 to the first voltage V1. In this case, because the comparison node ncp is floated by the turn-off of the second transistor TR2, as the screen voltage VSC increases, the comparison voltage VCP of the comparison node ncp may increase from the input voltage VIN to a fifth voltage V5 as much as ΔVCP1. In an embodiment, a magnitude of ΔVCP1 may correspond to a voltage increment (e.g., $\Delta V_{IOFF}$) of the screen voltage VSC. The voltage increment (e.g., $\Delta V_{IOFF}$) of the screen voltage VSC may refer to a value corresponding to the leakage current $I_{OFF}$ of the first driving line SI1. For example, through the operation in the time interval from the time point t2 to the time point t3, information corresponding to the leakage current $I_{OFF}$ of the first driving line SI1 may be stored in the second capacitor C2.

Afterwards, during a time interval from the time point t3 to the time point t4 of FIG. 7, the first block selection signal BLK_SEL1 may maintain the on-level ON, the first driving line control signal DR_SI1 may change to the off-level OFF, the first driving line selection signal SI_SEL1 may maintain the on-level ON, and the switching signal SW may maintain the off-level OFF.

Figure 8D:
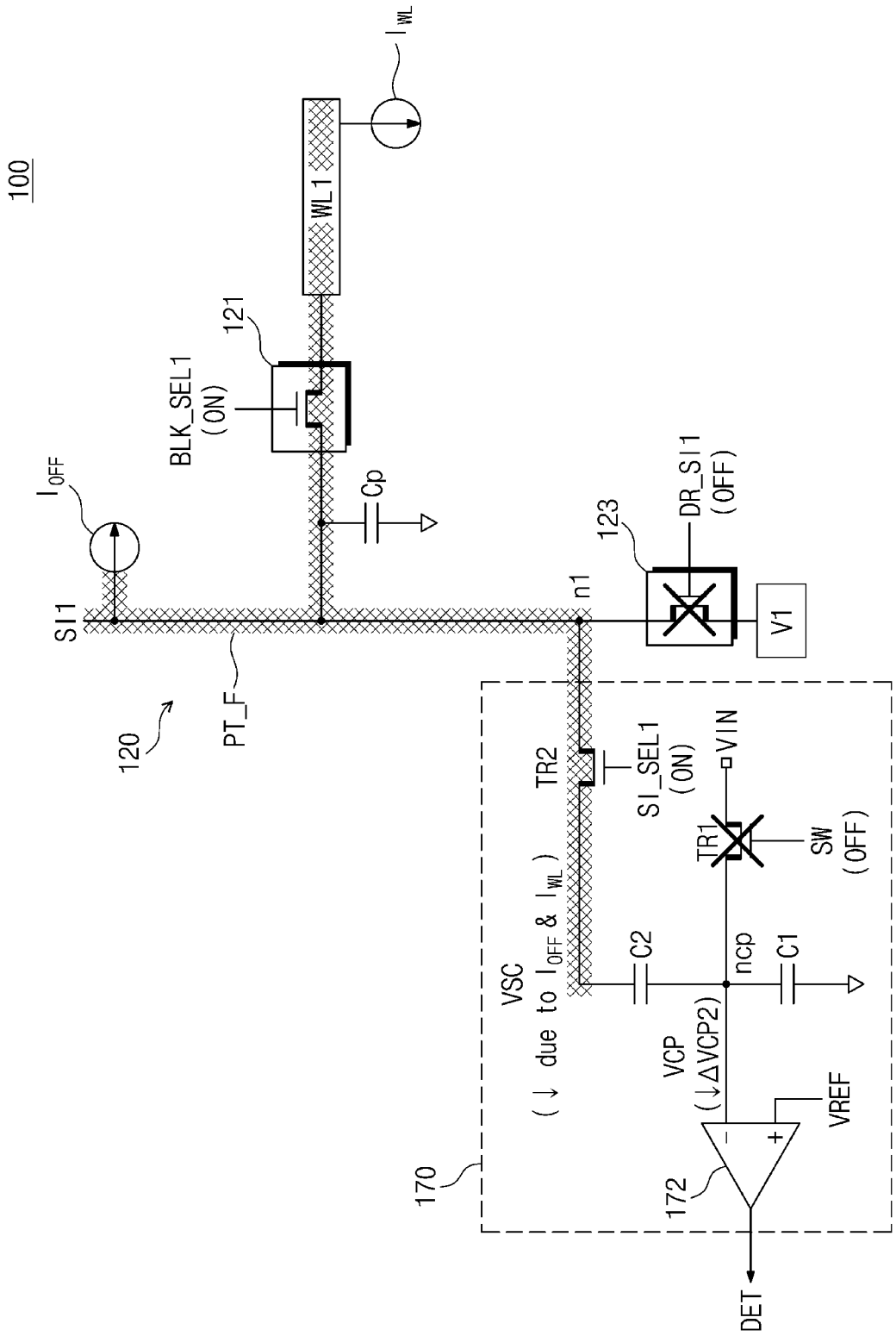

In this case, as illustrated in FIG. 8D, in response to the first driving line control signal DR_SI1 having the off-level OFF, the driving line driver 123 may block the first voltage V1, may be turned off, or may float the first driving line SI1. Operations according to the remaining signals BLK_SEL1, SI_SEL1, and SW are similar to those described with reference to FIG. 8C, and thus, additional description will be omitted to avoid redundancy. In this case, a full-path PT_F as illustrated in FIG. 8D may be formed. The full-path PT_F may refer to a current path that includes both the first driving line SI1 and the first word line WL1.

As illustrated in FIG. 8D, because a voltage is not provided to the full-path PT_F or a power source is not connected to the full-path PT_F (i.e., because the full-path PT_F is in a floating state), a voltage associated with the full-path PT_F may decrease due to the leakage current $I_{OFF}$ of the first driving line SI1 and the leakage current $I_{WL}$ of the first word line WL1. The screen voltage VSC may decrease by the voltage drop associated with the full-path PT_F. For example, as illustrated in FIG. 7, the screen voltage VSC may decrease from the first voltage V1 to a sixth voltage V6 as much as ($\Delta V_{IOFF}+\Delta V_{IWL}$). For example, during a time interval from the time point t3 to the time point t4, the voltage drop of the screen voltage VSC may include the voltage drop $\Delta V_{IOFF}$ due to the leakage current $I_{OFF}$ of the first driving line SI1 and the voltage drop $\Delta V_{IWL}$ due to the leakage current $I_{WL}$ of the first word line WL1.

Because the comparison node ncp is in a floating state, the comparison voltage VCP of the comparison node ncp may decrease from the fifth voltage V5 to a seventh voltage V7 as much as ΔVCP2 by the voltage drop (i.e., $\Delta V_{IOFF}+\Delta V_{IWL}$) of the screen voltage VSC. In this case, the voltage drop ΔVCP2 of the comparison voltage VCP may refer to a value corresponding to the voltage drop (i.e., $\Delta V_{IOFF}+\Delta V_{IWL}$) of the screen voltage VSC.

However, during the time interval from the time point t2 to the time point t3, because the comparison node ncp is in a state of being increased as much as a magnitude (e.g., ΔVCP1) corresponding to $\Delta V_{IOFF}$, the actual variation in the comparison voltage VCP at the time point t4 may be (ΔVCP–ΔVCP1). For example, the actual variation in the comparison voltage VCP at the time point t4 may be obtained by removing the voltage drop ΔVCP1 due to the leakage current $I_{OFF}$ of the first driving line SI1. This means that the actual variation in the comparison voltage VCP at the time point t4 includes only the voltage drop due to the leakage current $I_{WL}$ of the first word line WL1. Accordingly, the leakage detecting circuit 170 may detect only the leakage current $I_{WL}$ of the first word line WL1 except for the leakage current $I_{OFF}$ of the first driving line SI1. The leakage detecting circuit 170 may output the detection signal DET when the comparison voltage VCP has become lower than the reference voltage VREF due to the leakage current $I_{WL}$ of the first word line WL1.

In more detail, Equation 1 below shows the variations ΔVCP1 and ΔVCP2 of the comparison voltage VCP and the actual variation (ΔVCP2–ΔVCP1) in the comparison voltage VCP.

$$\Delta VCP1 = \frac{C_2}{C_1+C_2}\Delta V_{IOFF} \qquad \text{[Equation 1]}$$

$$\Delta VCP2 = \frac{C_2}{C_1+C_2}(\Delta V_{IOFF}+\Delta V_{IWL})$$

$$\Delta VCP2 - \Delta VCP1 = $$

$$\frac{C_2}{C_1+C_2}(\Delta V_{IOFF}-\Delta V_{IOFF}+\Delta V_{IWL}) = \frac{C_2}{C_1+C_2}(\Delta V_{IWL})$$

Referring to Equation 1, "C1" and "C2" represent capacitance values of the first and second capacitors C1 and C2, "$\Delta V_{IOFF}$" represents a voltage variation in the screen voltage VSC due to the leakage current $I_{OFF}$ of the first driving line SI1, and "$\Delta V_{IWL}$" represents a voltage variation in the screen voltage VSC due to the leakage current $I_{WL}$ of the first word line WL1. As understood from Equation 1, through the operation of the leakage detecting circuit 170, only a component corresponding to a voltage variation due to the leakage current $I_{WL}$ of the first word line WL1 is present in the actual variation in the comparison voltage VCP. For example, the leakage detecting circuit 170 according to the present disclosure may be configured to detect only a leakage current of a target word line without a separate counting operation.

In an embodiment, a first time interval T1 (e.g., the time interval from the time point t1 to the time point t2) for detecting the leakage current $I_{OFF}$ of the first driving line SI1 and a second time interval T2 (e.g., the time interval from the time point t3 to the time point t4) for detecting the leakage current $I_{OFF}$ of the first driving line SD and the leakage current $I_{WL}$ of the first word line WL1 may be determined at a specific ratio. For example, a connection structure of the leakage detecting circuit 170 and the row decoder 120 in the first time interval T1 may be different from that in the second time interval T2. In this case, an equivalent capacitance value of the first sub-path PT_S1 may be different from that of the full-path PT_F. Equation 2 shows how to control time lengths of the first time interval T1 and the second time interval T2 such that the voltage drop $\Delta V_{IOFF}$ due to the leakage current $I_{OFF}$ of the first driving line SI1 in the first time interval T1 is the same as that in the second time interval T2. It may be expressed that $C_{PTS1} \times \Delta V_{IOFF} = I_{OFF} \times T1$ and $C_{PTF} \times \Delta V_{IOFF} = I_{OFF} \times T2$. Thus, the first time interval T1 and the second time interval T2 may be determined by a predetermined ratio as Equation 2 below.

$$T1 = T2 \times \frac{C_{PTS1}}{C_{PTF}} \qquad \text{[Equation 2]}$$

Referring to Equation 2, "T1" represents a time length of the first time interval T1, and "T2" represents a time length of the second time interval T2. "$C_{PTS1}$" represents an equivalent capacitance value on the first sub-path PT_S1, and "$C_{PTF}$" represents an equivalent capacitance value on the full-path PT_F.

The equivalent capacitance value $C_{PTS1}$ on the first sub-path PT_S1 is expressed by Equation 3 below.

$$C_{PTS1} = CP + C_2 \qquad \text{[Equation 3]}$$

Referring to Equation 3, "Cp" represents a capacitance value of a peripheral capacitor Cp. The peripheral capacitor Cp may refer to a capacitor or parasitic capacitor formed by various elements included in a peripheral circuit of the memory device 100. In the first sub-path PT_S1, as illustrated in FIG. 8B, the first driving line SI1 may be floated (or disconnected) from both the first word line WL1 and the driving line driver 123, and the peripheral capacitor Cp and the second capacitor C2 may be present on the first sub-path PT_S1. For example, the equivalent capacitance value $C_{PTS1}$ on the first sub-path PT_S1 may be expressed by a sum of capacitance values of the peripheral capacitor Cp and the second capacitor C2.

The equivalent capacitance value $C_{PTF}$ on the full-path PT_F is expressed by Equation 4 below.

$$C_{PTF} = Cp + \frac{C_1 C_2}{C_1 + C_2} + C_{WL} \qquad \text{[Equation 4]}$$

Referring to Equation 4, "CWL" represents a capacitance value associated with the first word line WL1. In the full-path PT_F, as illustrated in FIG. 8D, the first driving line SI1 may be connected to the first word line WL1 and may be floated (or disconnected) from the driving line driver 123, and the peripheral capacitor Cp, the first capacitor C1, the second capacitor C2, and a capacitor of the first word line WL1 may be present on the full-path PT_F. For example, the equivalent capacitance value $C_{PTF}$ on the full-path PT_F may be expressed by a total capacitance value of the peripheral capacitor Cp, the first capacitor C1, the second capacitor C2, and the capacitor of the first word line WL1.

As described with reference to Equation 2 to Equation 4, because a current path in the first time interval T1 is different from that in the second time interval T2, an equivalent capacitance value of the current path in the first time interval T1 may be different from that in the second time interval T2. In this case, because a voltage decrement due to the leakage current $I_{OFF}$ of the first driving line SI1 in the first time interval T1 is different from that in the second time interval T2, capacitance values in the first and second time intervals T1 and T2 may be compensated for by adjusting a ratio of the first time interval T1 and the second time interval T2 as expressed by Equation 2.

As described above, a leakage detecting circuit according to the present disclosure may easily cancel out a leakage current (or unnecessary leakage current) of a driving line without a separate counting operation for storing a magnitude of the leakage current of the driving line. Accordingly, because a leakage current of each word line is accurately detected, the accuracy of detecting a leakage current may be improved. This means that the reliability of a memory device is improved.

Figure 9:
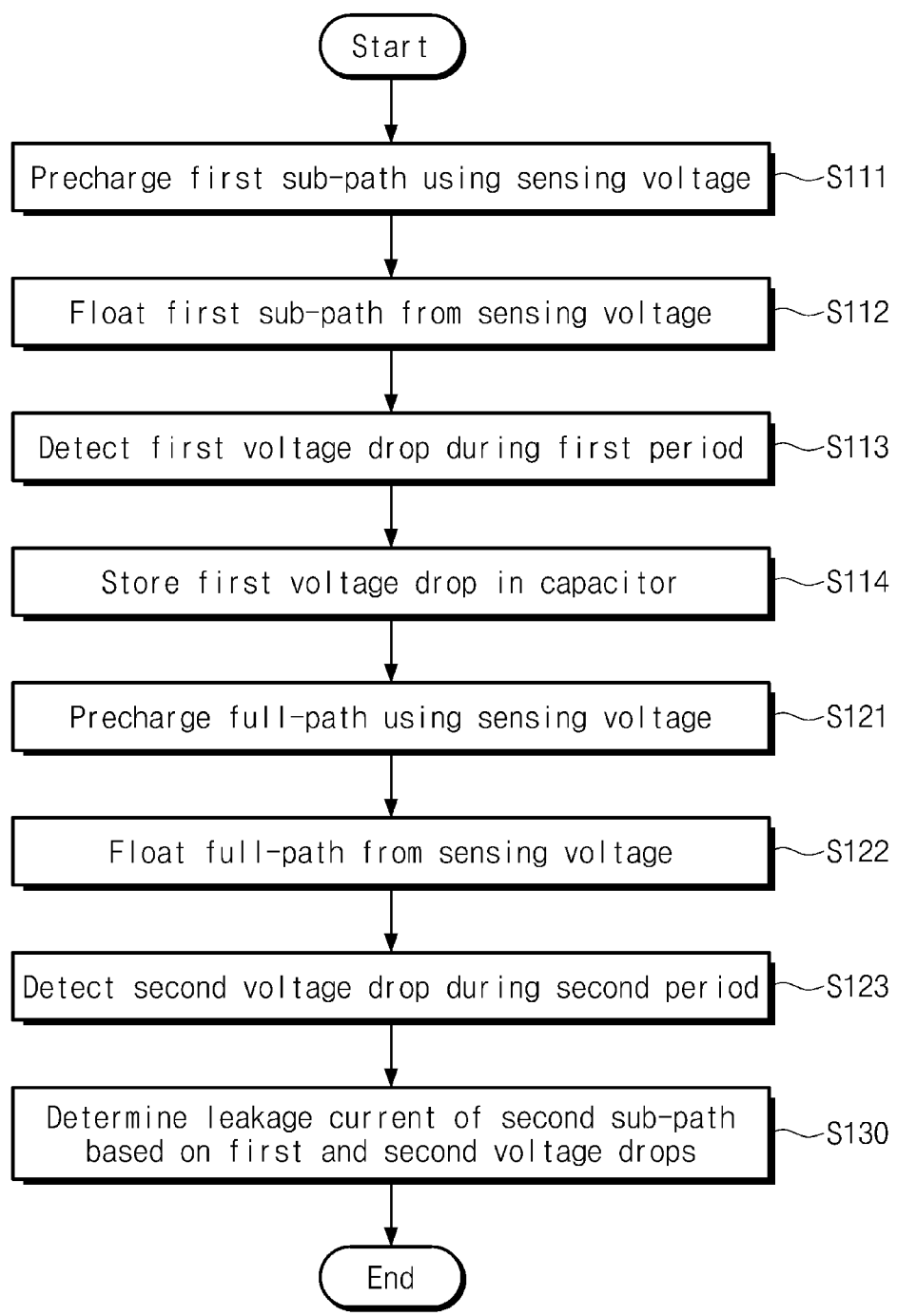
FIG. 9 is a flowchart illustrating an operation of a leakage detecting circuit of FIG. 5 according to example embodiments.

FIG. 9 is a flowchart illustrating an operation of a leakage detecting circuit of FIG. 5 according to example embodiments. Below, the terms "first sub-path" and "full-path" are used to describe embodiments of the present disclosure with a more general configuration. In this case, the first sub-path may be a current path including the first driving line SI1, which is described with reference to FIGS. 7 and 8A to 8D, and the full-path may be a current path including the first driving line SI1 and the first word line WL1, which is described with reference to FIGS. 7 and 8A to 8D.

Referring to FIGS. 5 and 9, in operation S111, the leakage detecting circuit 170 may precharge the first sub-path by using a sensing voltage. For example, the leakage detecting circuit 170 may precharge the first sub-path with the sensing voltage (i.e., the first voltage V1) like the time interval from the time point t0 to the time point t1 of FIG. 7.

In operation S112, the leakage detecting circuit 170 may float the first sub-path from the sensing voltage. For example, the leakage detecting circuit 170 may float the first sub-path by turning off the driving line driver 123 or blocking the first voltage V1 provided to the first driving line SI1, like the time interval from the time point t1 to the time point t2 of FIG. 7.

In operation S113, the leakage detecting circuit 170 may detect a first voltage drop during the first phase. For example, the leakage detecting circuit 170 may detect a voltage drop of the first sub-path as the voltage drop $\Delta V_{IOFF}$ of the screen voltage VSC like the time interval from the time point t1 to the time point t2 of FIG. 7.

In operation S114, the leakage detecting circuit 170 may store information about the first voltage drop in a capacitor. For example, the leakage detecting circuit 170 may store information corresponding to the voltage drop $\Delta V_{IOFF}$ of the screen voltage VSC in the second capacitor C2, like the time interval from the time point t2 to the time point t3 of FIG. 7. In an embodiment, the information corresponding to the voltage drop $\Delta V_{IOFF}$ of the screen voltage VSC may be stored in the second capacitor C2 as a voltage increment $\Delta VCP1$ of the comparison voltage VCP of the comparison node ncp.

In operation S121, the leakage detecting circuit 170 may precharge the full-path by using the sensing voltage. For example, the leakage detecting circuit 170 may precharge the first driving line SI1 and the first word line WL1 with the first voltage V1, like the time interval from the time point t2 to the time point t3 of FIG. 7.

In operation S122, the leakage detecting circuit 170 may float the full-path from the sensing voltage. For example, the leakage detecting circuit 170 may float the full-path by turning off the driving line driver 123 or blocking the first voltage V1 provided to the first driving line SI1, like the time interval from the time point t3 to the time point t4 of FIG. 7.

In operation S123, the leakage detecting circuit 170 may detect a second voltage drop during the second phase. For example, the leakage detecting circuit 170 may detect a voltage drop of the full-path as the voltage drop ($\Delta V_{IOFF}$+

$\Delta V_{IWL}$) of the screen voltage VSC, like the time interval from the time point t3 to the time point t4 of FIG. 7.

In operation S130, the leakage detecting circuit 170 may determine a leakage current of a second sub-path based on the first voltage drop and the second voltage drop. For example, as described with reference to FIGS. 7 and 8A to 8D, at the time point t3, the comparison voltage VCP may be the fifth voltage V5 that is increased from the input voltage VIN as much as $\Delta$VCP1. During the time interval from the time point t3 to the time point t4, a voltage drop of the comparison voltage VCP of the comparison node ncp may be $\Delta$VCP2. For example, the actual voltage decrement of the comparison voltage VCP from the input voltage VIN may be ($\Delta$VCP2−$\Delta$VCP1) and may correspond to a component due to the leakage current $I_{WL}$ of the first word line WL1 (i.e., the second sub-path). The leakage detecting circuit 170 may determine whether the leakage current $I_{WL}$ of the first word line WL1 occurs or whether the leakage current $I_{WL}$ is greater than a reference value, by comparing the actual voltage decrement ($\Delta$VCP2−$\Delta$VCP1) of the comparison voltage VCP and the reference voltage VREF.

The flowchart described with reference to FIG. 9 may be classified into a plurality of steps for the purpose of showing an operation of the leakage detecting circuit 170 clearly, but the present disclosure is not limited thereto. For example, some of the plurality of steps may be performed at the same time or may be performed through a single operation. For example, operation S112 and operation S113 may be performed in a single time interval from the time point t1 to the time point t2 of FIG. 7 such that the first sub-path is floated and a first voltage drop of the first sub-path is detected. Operation S114 and operation S121 may be performed in a single time interval from the time point t2 to the time point t3 of FIG. 7 such that the first voltage drop is stored in a capacitor and a full-path is precharged with a sensing voltage. Operation S122, operation S123 and operation S130 may be performed in a single time interval from the time point t3 to the time point t4 of FIG. 7 such that the full-path is floated, the second voltage drop is detected, and a leakage current of the second sub-path is determined.

Figure 10:
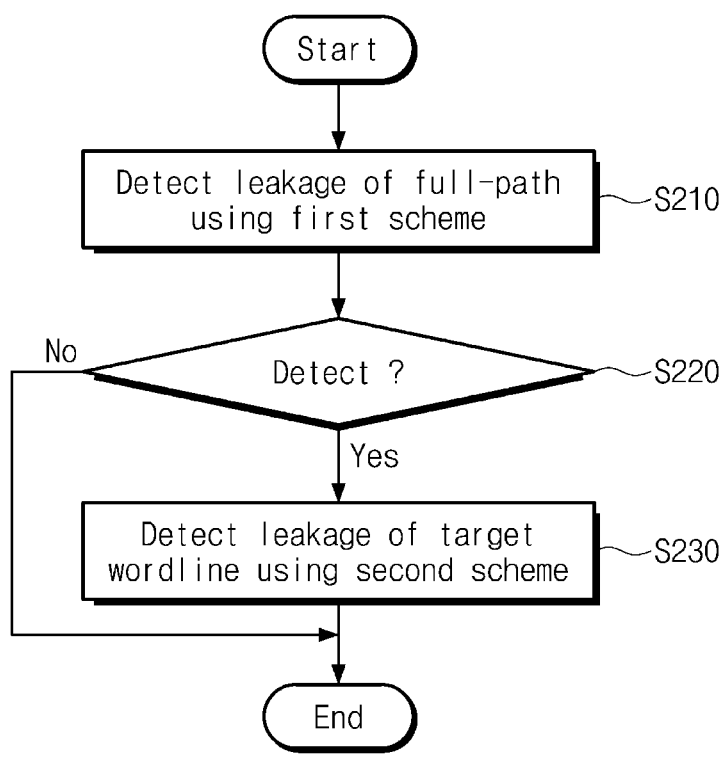
FIG. 10 is a flowchart illustrating an operation of a memory device of FIG. 1 according to example embodiments.

FIG. 10 is a flowchart illustrating an operation of a memory device of FIG. 1 according to example embodiments. Referring to FIGS. 1 and 10, in operation S210, the memory device 100 may detect a leakage of a full-path by using a first scheme. For example, the memory device 100 may include the leakage detecting circuit 170. The leakage detecting circuit 170 may detect a leakage current of the first word line WL1 based on the method described with reference to FIG. 6.

In operation S220, the memory device 100 may determine whether a leakage current of a full-path is detected. For example, the full-path may refer to a current path including a target word line from which a leakage current is to be detected and a driving line corresponding to the target word line. The control logic circuit 150 of the memory device 100 may determine whether a leakage current is detected, based on the detection signal DET output from the leakage detecting circuit 170.

In an embodiment, that a leakage current is not detected through the first scheme may mean that a leakage current does not occur at the target word line and the corresponding driving line. Accordingly, when a leakage current is not detected, the memory device 100 may not perform any other specific operation or may perform a normal operation (e.g., a program operation, a read operation, or an erase operation) under control of an external device (e.g., a memory controller).

When a leakage current is detected through the first scheme, in operation S230, the memory device 100 may detect a leakage current of the target word line through a second scheme. For example, the second scheme may refer to the leakage current detecting method described with reference to FIGS. 7, 8A to 8D and 9. The leakage detecting circuit 170 of the memory device 100 may detect a leakage current of the target word line based on the second scheme. In this case, as described with reference to FIGS. 7, 8A to 8D and 9, only a leakage current of the target word line may be accurately detected by removing or canceling out a leakage current component of a driving line.

As described above, the memory device 100 according to the present disclosure may selectively perform an operation of detecting a leakage current of a full-path associated with a target word line based on the first scheme and detecting a leakage current of the target word line based on the second scheme, depending on a result of the detection. In this case, a time that is taken to detect leakage currents of all word lines may decrease.

Figure 11:
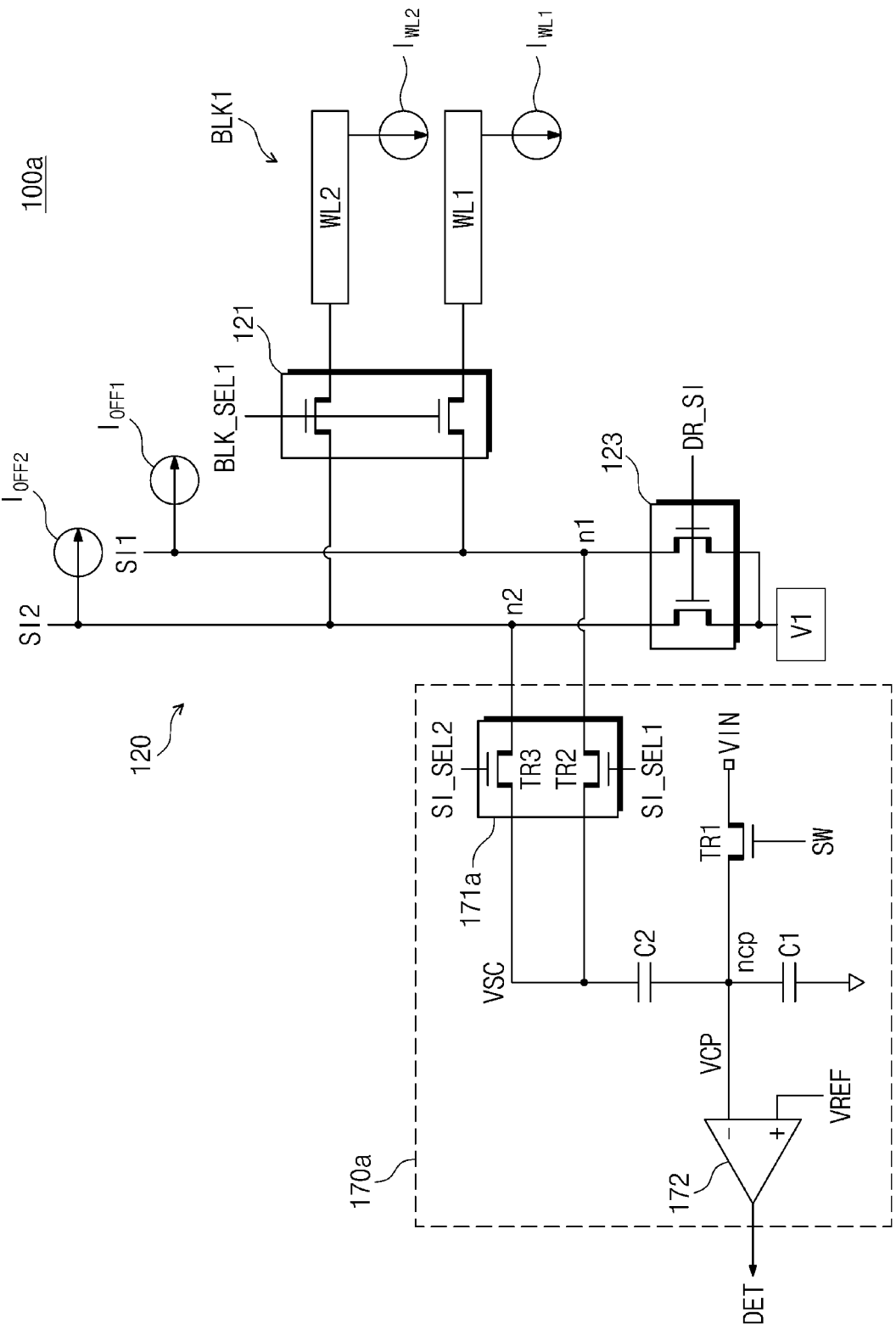
FIG. 11 is a diagram schematically illustrating a memory device of FIG. 3 according to example embodiments.

FIG. 11 is a diagram schematically illustrating a memory device of FIG. 3 according to example embodiments. For brevity of drawing and convenience of description, additional description associated with the components described above will be omitted to avoid redundancy.

Referring to FIGS. 3 and 11, the row decoder 120 of a memory device 100a may include first and second driving lines SI1 and SI2, the first block selecting circuit 121, and the driving line driver 123. The first block selecting circuit 121 may respectively connect the first and second driving lines SI1 and SI2 to the first and second word lines WL1 and WL2 in response to the first block selection signal BLK_SEL1.

A leakage detecting circuit 170a may include the first transistor TR1, the first capacitor C1, the second capacitor C2, a driving line selector 171a, and the comparator 172. The comparator 172, the first transistor TR1, the first capacitor C1, and the second capacitor C2 are described above, and thus, additional description will be omitted to avoid redundancy.

In the above embodiments, the leakage detecting circuit 170 performs the leakage current detecting operation on one target word line, but the present disclosure is not limited thereto. As illustrated in FIG. 11, the leakage detecting circuit 170a may perform the leakage current detecting operation on a plurality of word lines (e.g., WL1 and WL2) at the same time or at once.

For example, the driving line selector 171a may include a second transistor TR2 and a third transistor TR3. The second transistor TR2 may be connected between the first node n1 of the first driving line SI1 and the second capacitor C2 and may operate in response to the first driving line selection signal SI_SEL1. The third transistor TR3 may be connected between a second node n2 of the second driving line SI2 and the second capacitor C2 and may operate in response to a second driving line selection signal SI_SEL2.

An operation principle of the leakage detecting circuit 170a of FIG. 11 is similar to that of the above embodiments except that the leakage current detecting operation is performed on the first and second word lines WL1 and WL2 at the same time or at once.

For example, in response to the driving line control signal DR_SI, the driving line driver 123 may simultaneously apply the first voltage V1 to the first and second driving lines SI1 and SI2 or may simultaneously block the supply of the first voltage V1 to the first and second driving lines SI1 and SI2. The second and third transistors TR2 and TR3 of the driving line selector 171a may be simultaneously turned on or turned off in response to the first and second driving line selection signals SI_SEL1 and SI_SEL2. In this case, through the operation of the first phase described with reference to FIG. 7, a voltage decrement due to the leakage currents $I_{OFF1}$ and $I_{OFF2}$ of the first and second driving lines SI1 and SI2 may be stored in the second capacitor C2 as a voltage increment of the comparison voltage VCP, and leakage currents $I_{WL1}$ and $I_{WL2}$ of the first and second word lines WL1 and WL2 may be simultaneously detected by removing or canceling out the leakage currents $I_{OFF1}$ and $I_{OFF2}$ of the first and second driving lines SI1 and SI2 through the operation of the second phase described with reference to FIG. 7.

As described above, the memory device 100a may simultaneously perform the leakage detecting operation on at least two or more target word lines or word line groups, and thus, a time that is taken to perform the leakage detecting operation on all word lines may be reduced.

In an embodiment, when a leakage current is detected from a specific word line group, the memory device 100a may perform the leakage detecting operation on each of word lines included in the specific word line group, based on the method described with reference to FIGS. 1 to 7, 8A to 8D, 9 and 10.

Figure 12:
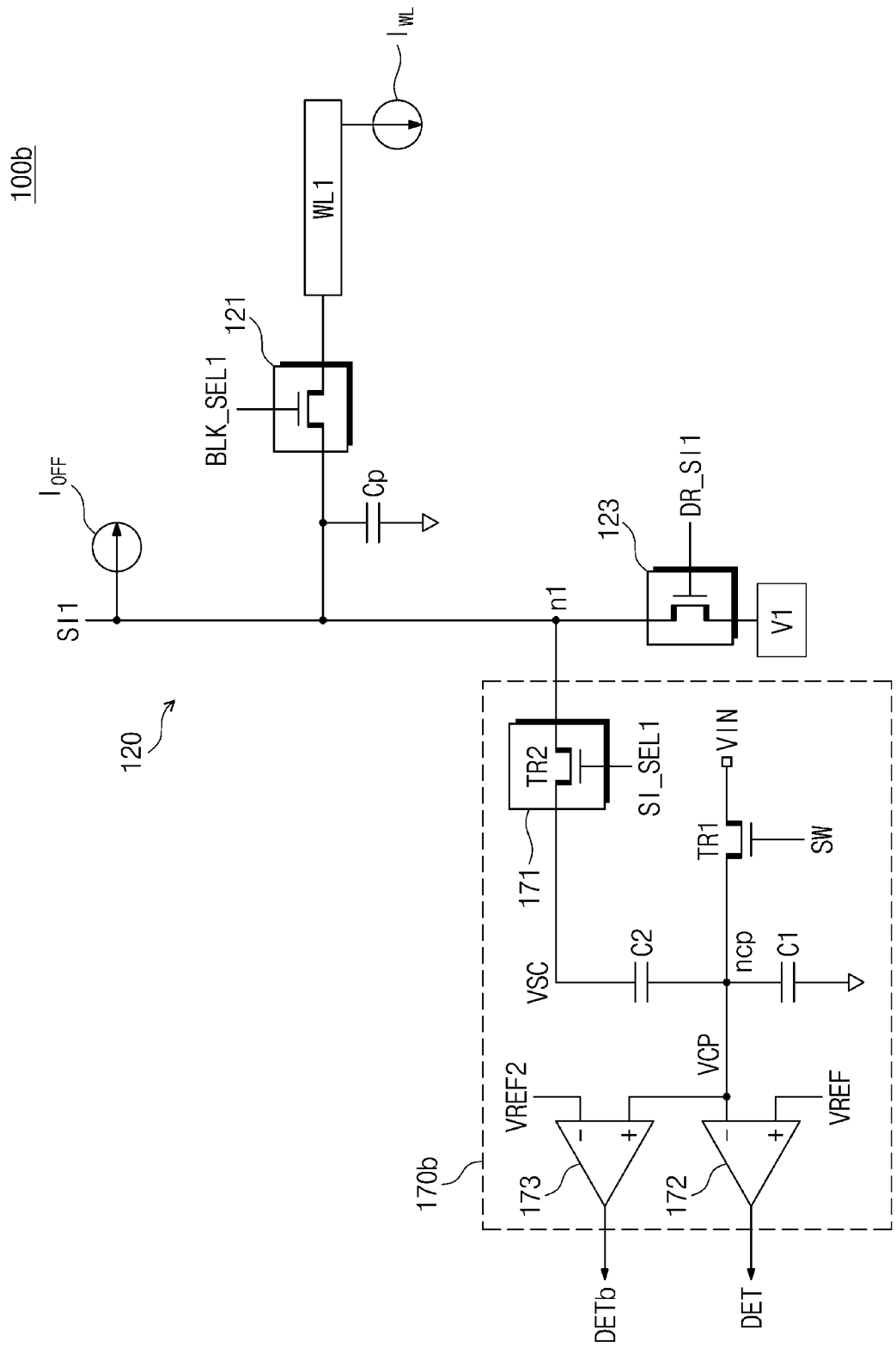
FIG. 12 is a diagram schematically illustrating a memory device of FIG. 3 according to example embodiments.

FIG. 12 is a diagram schematically illustrating a memory device of FIG. 3 according to example embodiments. For brevity of drawing and convenience of description, additional description associated with the components described above will be omitted to avoid redundancy.

Referring to FIGS. 3 and 12, a memory device 100b may include the row decoder 120 and a leakage detecting circuit 170b. The row decoder 120 may include the first block selecting circuit 121, the first driving line SI1, and the driving line driver 123. The first block selecting circuit 121 may connect the first driving line SI1 with the first word line WL1 in response to the first block selection signal BLK_SEL1. The driving line driver 123 may selectively provide the first voltage V1 to the first driving line SI1 in response to the first driving line control signal DR_SI1. A configuration of the row decoder 120 is described above, and thus, additional description will be omitted to avoid redundancy.

The leakage detecting circuit 170b may include the first transistor TR1, the second transistor TR2 (or the driving line selector 171), the first capacitor C1, the second capacitor C2, and the first comparator 172. The first transistor TR1, the second transistor TR2 (or the driving line selector 171), the first capacitor C1, the second capacitor C2, and the first comparator 172 are described above, and thus, additional description will be omitted to avoid redundancy.

The leakage detecting circuit 170b may further include a second comparator 173. The second comparator 173 may compare a second reference voltage VREF2 and the comparison voltage VCP and may output a second detection signal DETb as a comparison result. For example, an inverting input terminal (−) of the second comparator 173 may receive the second reference voltage VREF2, and a non-inverting input terminal (+) thereof may receive the comparison voltage VCP. When the comparison voltage VCP is greater than the second reference voltage VREF2, the second comparator 173 may output the second detection signal DETb. In this case, the second detection signal DETb may have the on-level ON.

In this case, the second detection signal DETb may indicate whether the leakage current $I_{OFF}$ of the first driving line SI1 exceeds a reference value. For example, as described with reference to FIG. 7, during the time interval from the time point t2 to the time point t3, the comparison voltage VCP may increase as much as ΔVCP1, and ΔVCP1 may refer to a level corresponding to the leakage current $I_{OFF}$ of the first driving line SI1. For example, when the leakage current $I_{OFF}$ of the first driving line SI1 increases, ΔVCP1 may increases, and thus, a level of the comparison voltage VCP may increase. That the level of the comparison voltage VCP is greater than the second reference voltage VREF2 may mean that the leakage current $I_{OFF}$ of the first driving line SI1 exceeds the reference value. In this case, the leakage detecting circuit 170b may output the second detection signal DETb.

As described above, the leakage detecting circuit 170b may further detect the leakage current $I_{OFF}$ of the first sub-path PT_S1 (or the first driving line SI1) by comparing the comparison voltage VCP and the second reference voltage VREF2.

Figure 13:
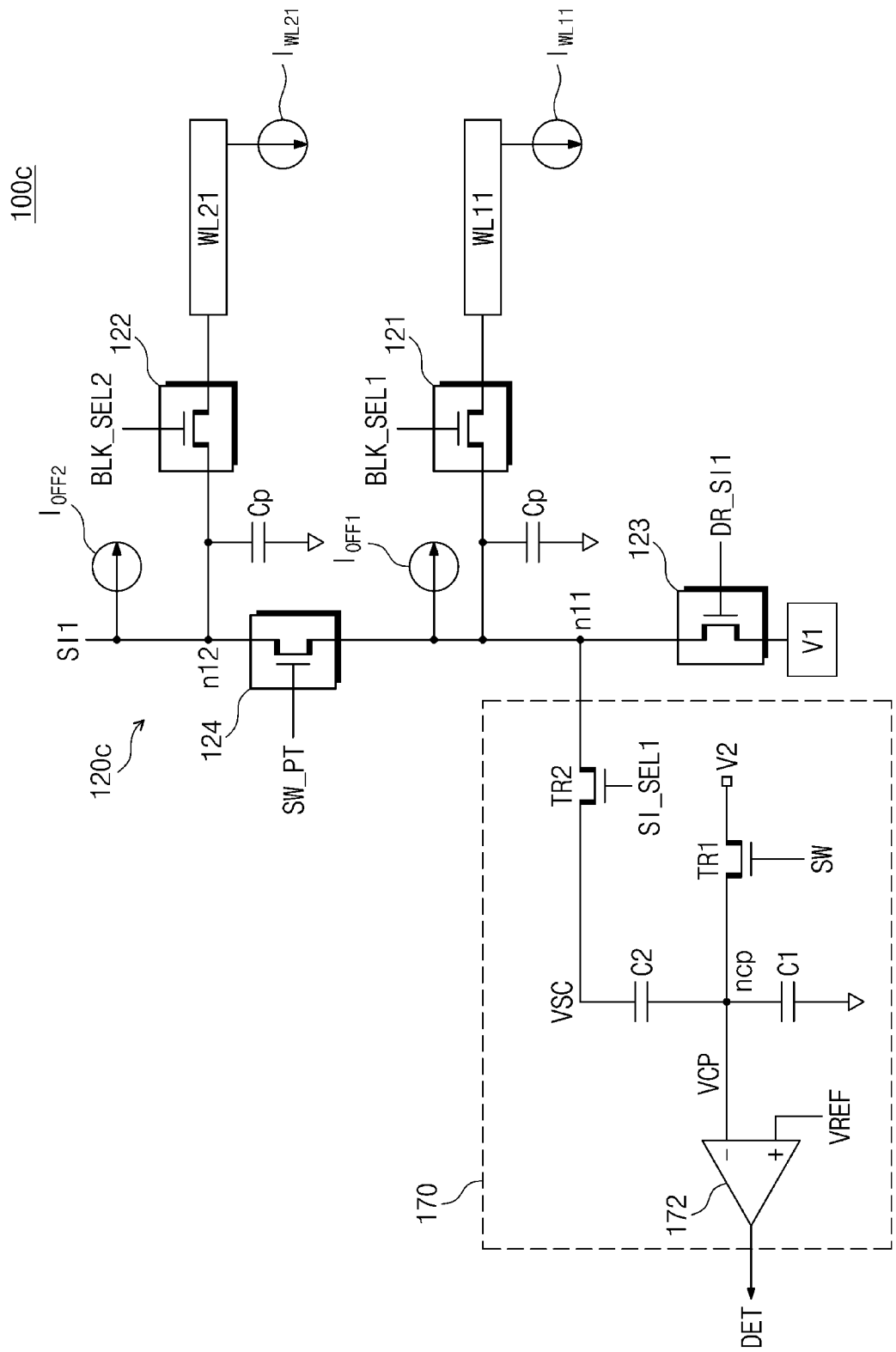
FIG. 13 is a diagram schematically illustrating a memory device of FIG. 3 according to example embodiments.
Figure 14:
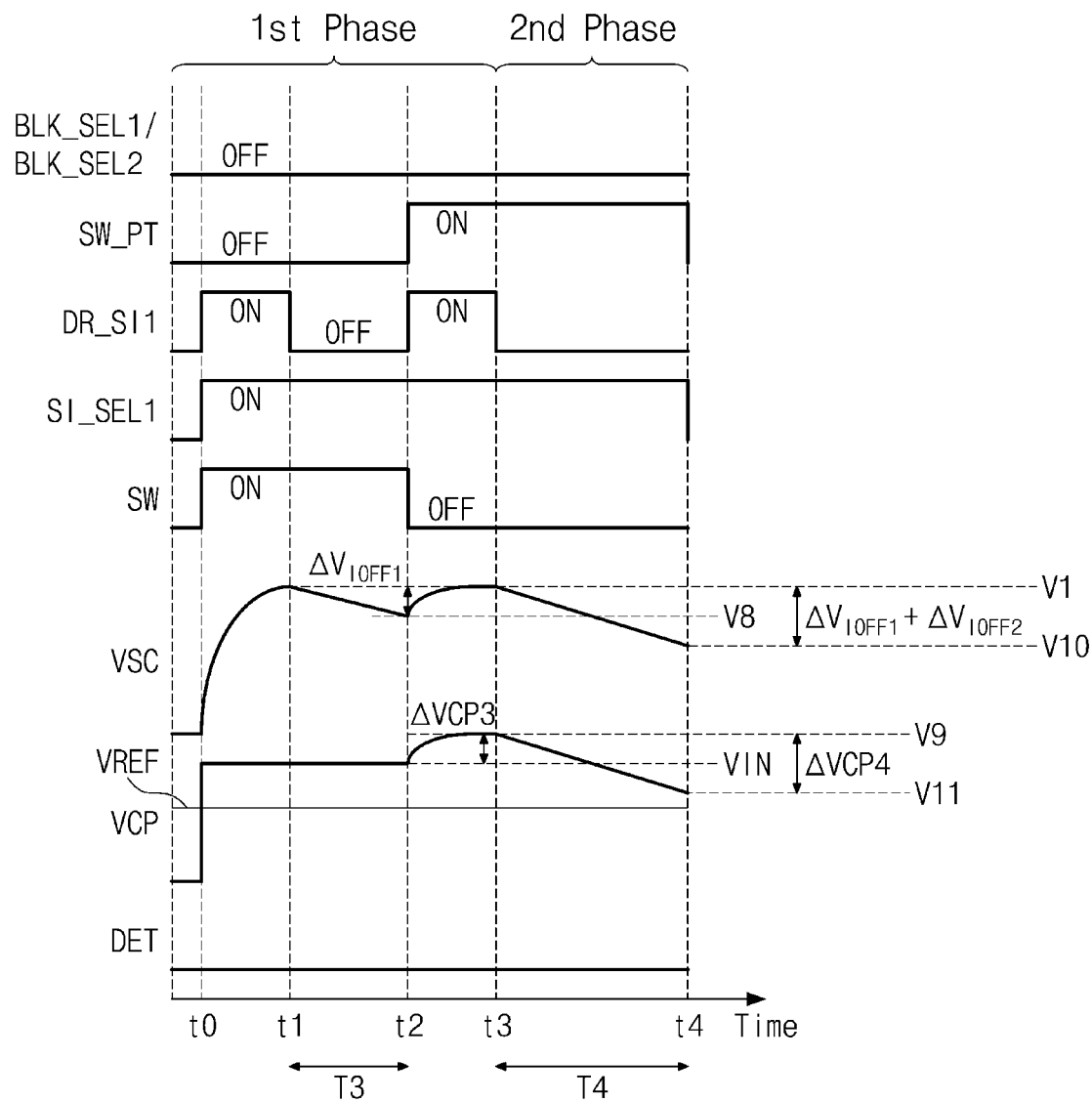
FIG. 14 is a timing diagram illustrating an operation of a memory device of FIG. 13 according to example embodiments.

FIG. 13 is a diagram schematically illustrating a memory device of FIG. 3 according to example embodiments. FIG. 14 is a timing diagram illustrating an operation of a memory device of FIG. 13 according to example embodiments. For brevity of drawing and convenience of description, additional description associated with the components described above will be omitted to avoid redundancy.

Referring to FIGS. 3 and 13, the leakage detecting circuit 170 of a memory device 100c may include the first transistor TR1, the second transistor TR2, the first capacitor C1, the second capacitor C2, and the comparator 172. The leakage detecting circuit 170 is described above, and thus, additional description will be omitted to avoid redundancy.

A row decoder 120c of the memory device 100c may include the first driving line SI1, the first block selecting circuit 121, the second block selecting circuit 122, and the driving line driver 123. The components of the row decoder 120c are described above, and thus, additional description will be omitted to avoid redundancy.

In an embodiment, the row decoder 120c may further include a driving line switch 124. In response to a path switching signal SW_PT, the driving line switch 124 may connect sections of the first driving line SI1, may float the sections of the first driving line SI1, or may disconnect the sections of the first driving line SI1 from each other. For example, the driving line switch 124 may be connected between a node n11 and a node n12 and may operate in response to the path switching signal SW_PT. The node n11 may refer to a node at which the first driving line SI1 is connected to the word line WL11 through the first block selecting circuit 121, and the node n12 may refer to a node at which the first driving line SI1 is connected to the word line WL21 through the second block selecting circuit 122.

In an embodiment, the memory device 100c may be configured to detect a leakage current of some sections of the first driving line SI1. For example, the first driving line SI1 may be connected to a word line of each of a plurality of memory blocks, and leakage currents of the sections of the first driving line SI1 may differ from each other. As illustrated in FIG. 13, a first leakage current $I_{OFF1}$ may occur at the node n11, and a second leakage current $I_{OFF2}$ may occur at the node n12. In this case, the memory device 100c may detect the second leakage current $I_{OFF2}$ through operations that are similar to those described above.

In more detail, as illustrated in FIG. 14, the first and second block selection signals BLK_SEL1 and BLK_SEL2 may maintain the off-level OFF. The path switching signal SW_PT may be maintained at the off-level OFF from a time point t0 to a time point t2 and may be maintained at the on-level ON from the time point t2 to a time point t4. The first driving line control signal DR_SI1, the first driving line selection signal SI_SEL1, and the switching signal SW are similar to those described with reference to FIG. 7, and thus, additional description will be omitted to avoid redundancy.

According to the timing diagram of FIG. 14, in the first phase, the screen voltage VSC may decrease from the first voltage V1 to an eighth voltage V8 as much as $\Delta V_{IOFF1}$, and information corresponding to $\Delta V_{IOFF1}$ may be stored in the second capacitor C2 through the following precharge operation (i.e., the comparison voltage VCP increases from the input voltage VIN to a ninth voltage V9 as much as $\Delta VCP3$). Afterwards, in the second phase, the screen voltage VSC decreases from the first voltage V1 to a tenth voltage V10 as much as $(\Delta V_{IOFF1}+\Delta V_{IOFF2})$, and thus, the comparison voltage VCP decreases from the ninth voltage V9 to an eleventh voltage V11 as much as $\Delta VCP4$. As a result, as in the above description, the actual voltage decrement of the comparison voltage VCP from the input voltage VIN may be $(\Delta VCP4-\Delta VCP3)$, which is a value corresponding to the second leakage current $I_{OFF2}$. Accordingly, the leakage detecting circuit 170c may accurately detect only a component of the second leakage current $I_{OFF2}$ occurring at some sections of the first driving line SI1.

As described above, a memory device according to the present disclosure may accurately detect a leakage current of a word line and also may accurately detect a leakage current of a specific section of a driving line or any other signal line(s). In this case, the reliability and lifetime of the memory device may be improved. For example, in the embodiment of FIG. 13, the first leakage current $I_{OFF1}$ of the node n11 of the first driving line SI1 may be small enough to ignore, but the second leakage current $I_{OFF2}$ of the node n12 of the first driving line SI1 may be great enough to hinder a normal operation of the memory device. In this case, the memory device may turn off the driving line switch 124 and may not use blocks after the driving line switch 124. As such, because the remaining memory blocks are normally used, the utilization or lifetime of the memory device may be improved.

In an embodiment, the configuration of the driving line switch 124 described with reference to FIGS. 13 and 14 is only an example, and the present disclosure is not limited thereto. The driving line switch may be implemented on each of a plurality of driving lines in units of memory block or in units of memory block group. The leakage detecting circuit may detect a leakage current of various signal lines included in the memory device, through each of the above embodiments or a combinations thereof.

Figure 15:
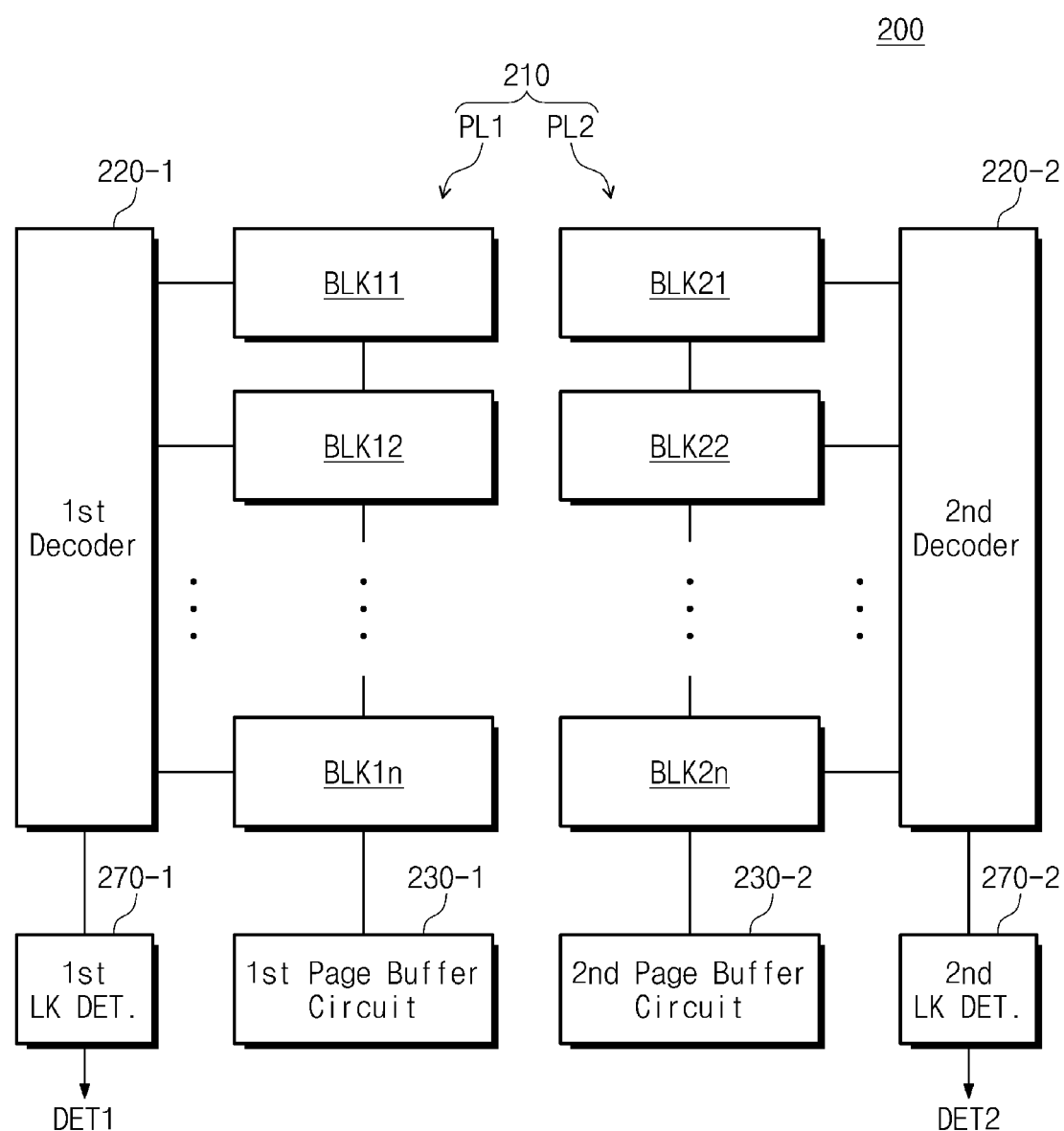
FIG. 15 is a block diagram illustrating a memory device according to an embodiment of the present disclosure.

FIG. 15 is a block diagram illustrating a memory device according to an embodiment of the present disclosure. For brevity of drawing, some components of a memory device 200 will be omitted, but the present disclosure is not limited thereto.

Referring to FIG. 15, the memory device 200 may include a memory cell array 210, first and second decoders 220-1 and 220-2, first and second page buffer circuits 230-1 and 230-2, and first and second leakage detecting circuits 270-1 and 270-2.

The memory cell array 210 may include a first plane PL1 and a second plane PL2. The first plane PL1 may include a plurality of memory blocks BLK11 to BLK1n, and the second plane PL2 may include a plurality of memory blocks BLK21 to BLK2n. The first row decoder 220-1 may control the memory blocks BLK11 to BLK1n of the first plane PL1, and the second row decoder 220-2 may control the memory blocks BLK21 to BLK2n of the second plane PL2. The first page buffer circuit 230-1 may control bit lines of the memory blocks BLK11 to BLK1n of the first plane PL1, and the second page buffer circuit 230-2 may control bit lines of the memory blocks BLK21 to BLK2n of the second plane PL2.

The first leakage detecting circuit 270-1 may detect a leakage current of the memory blocks BLK11 to BLK1n of the first plane PL1 through driving lines of the first decoder 220-1 and may output a first detection signal DET1 as a detection result. The second leakage detecting circuit 270-2 may detect a leakage current of the memory blocks BLK21 to BLK2n of the second plane PL2 through driving lines of the second decoder 220-2 and may output a second detection signal DET2 as a detection result. In an embodiment, as illustrated in FIG. 15, a leakage detecting circuit (e.g., 270-1 or 270-2) of the memory device 200 may be provided in units of decoder or in units of plane, but the present disclosure is not limited thereto. Alternatively, the memory device 200 may further include a plurality of planes, and the leakage detecting circuit may be provided for each of the plurality of planes.

Figure 16:
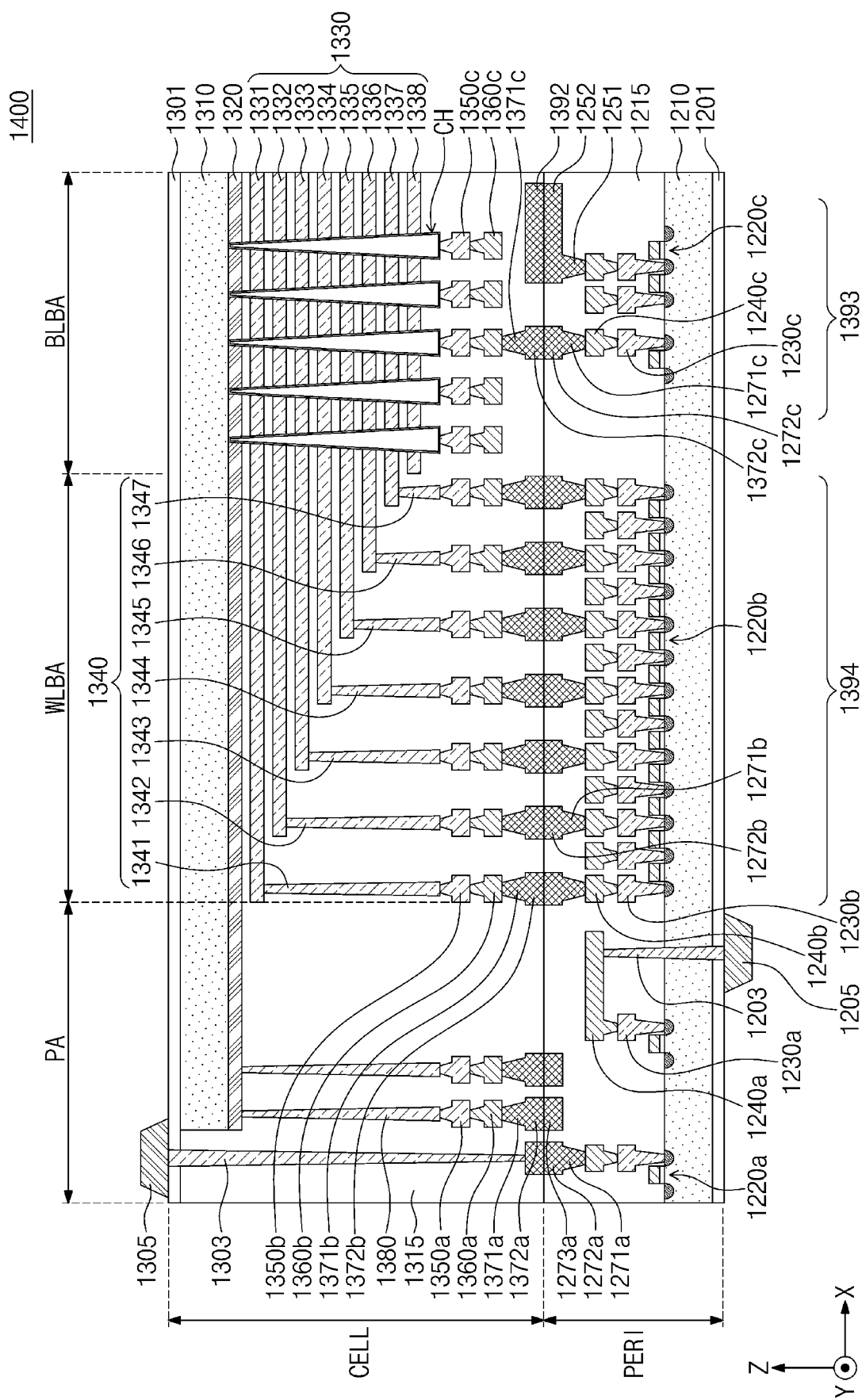
FIG. 16 is a cross-sectional view illustrating a memory device according to an embodiment of the present disclosure.

FIG. 16 is a cross-sectional view illustrating a memory device according to example embodiments. Referring to FIG. 16, a memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 1600 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 124a, 1240b, and 1240c formed on the first metal layers 1230a, 1230b, and 1230c. Each of the circuit elements 1220a, 1220b, and 1220c may include one or more transistors. In an example embodiment, the first metal layers 1230a, 1230b, and 1230c may be formed of tungsten having relatively high electrical resistivity, and the second metal layers 124a, 1240b, and 1240c may be formed of copper having relatively low electrical resistivity.

In an example embodiment illustrate in FIG. 16, although only the first metal layers 1230a, 1230b, and 1230c and the second metal layers 124a, 1240b, and 1240c are shown and described, the example embodiment is not limited thereto, and one or more additional metal layers may be further formed on the second metal layers 124a, 1240b, and 1240c. At least a portion of the one or more additional metal layers formed on the second metal layers 124a, 1240b, and 1240c may be formed of aluminum or the like having a lower electrical resistivity than those of copper forming the second metal layers 124a, 1240b, and 1240c.

The interlayer insulating layer 1215 may be disposed on the first substrate 1210 and cover the plurality of circuit elements 1220a, 1220b, and 1220c, the first metal layers 1230a, 1230b, and 1230c, and the second metal layers 124a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b in the peripheral circuit region PERI may be electrically bonded to upper bonding metals 1371b and 1372b of the cell region CELL. The lower bonding metals 1271b and 1272b and the upper bonding metals 1371b and 1372b may be formed of aluminum, copper, tungsten, or the like. Further, the upper bonding metals 1371b and 1372b in the cell region CELL may be referred as first metal pads and the lower bonding metals 1271b and 1272b in the peripheral circuit region PERI may be referred as second metal pads. The first metal pads and the second metal pads may be connected to each other in a bonding manner.

The cell region CELL may include at least one memory block. The cell region CELL may include a second substrate 1310, an interlayer insulating layer 1315, and a common source line 1320. On the second substrate 1310, a plurality of word lines 1331 to 1338 (i.e., 1330) may be stacked in a direction (a Z-axis direction), perpendicular to an upper surface of the second substrate 1310. At least one string selection line and at least one ground selection line may be arranged on and below the plurality of word lines 1330, respectively, and the plurality of word lines 1330 may be disposed between the at least one string selection line and the at least one ground selection line.

In the bit line bonding area BLBA, a channel structure CH may extend in a direction (a Z-axis direction), perpendicular to the upper surface of the second substrate 1310, and pass through the plurality of word lines 1330, the at least one string selection line, and the at least one ground selection line. The channel structure CH may include a data storage layer, a channel layer, a buried insulating layer, and the like, and the channel layer may be electrically connected to a first metal layer 1350c and a second metal layer 1360c. The data storage layer, the channel layer and the buried insulating layer of the channel structure CH may be formed in a channel hole. For example, the first metal layer 1350c may be a bit line contact, and the second metal layer 1360c may be a bit line. In an example embodiment, the bit line 1360c may extend in a first direction (a Y-axis direction), parallel to the upper surface of the second substrate 1310.

The interlayer insulating layer 1315 may be disposed on the second substrate 1310 to cover the common source line 1320, the plurality of word lines 1330, a plurality of cell contact plugs 1340, first metal layers 1350a, 1350b, and 1350c, and second metal layers 1360a, 1360b, and 1360c. The interlayer insulating layer 1315 may include an insulating material such as silicon oxide, silicon nitride, or the like.

In an example embodiment illustrated in FIG. 16, an area in which the channel structure CH, the bit line 1360c, and the like are disposed may be defined as the bit line bonding area BLBA. In the bit line bonding area BLBA, the bit line 1360c may be electrically connected to the circuit elements 1220c providing a page buffer 1393 in the peripheral circuit region PERI. The bit line 1360c may be connected to upper bonding metals 1371c and 1372c in the cell region CELL, and the upper bonding metals 1371c and 1372c may be connected to lower bonding metals 1271c and 1272c connected to the circuit elements 1220c of the page buffer 1393. In an example embodiment, a program operation may be executed based on a page unit as write data of the page-unit is stored in the page buffer 1393, and a read operation may be executed based on a sub-page unit as read data of the sub-page unit is stored in the page buffer 1393. Also, in the program operation and the read operation, units of data transmitted through bit lines may be different from each other.

In the word line bonding area WLBA, the plurality of word lines 1330 may extend in a second direction (an X-axis direction), parallel to the upper surface of the second substrate 1310 and perpendicular to the first direction, and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the second direction. A first metal layer 1350b and a second metal layer 1860b may be connected to an upper portion of the plurality of cell contact plugs 1340 connected to the plurality of word lines 1330, sequentially. The plurality of cell contact plugs 1340 may be connected to the peripheral circuit region PERI by the upper bonding metals 1371b and 1372b of the cell region CELL and the lower bonding metals 1271b and 1272b of the peripheral circuit region PERI in the word line bonding area WLBA.

The plurality of cell contact plugs 1340 may be electrically connected to the circuit elements 1220b forming a row decoder 1394 in the peripheral circuit region PERI. In an example embodiment, operating voltages of the circuit elements 1220b of the row decoder 1394 may be different than operating voltages of the circuit elements 1220c forming the page buffer 1393. For example, operating voltages of the circuit elements 1220c forming the page buffer 1393 may be greater than operating voltages of the circuit elements 1220b forming the row decoder 1394.

A common source line contact plug 1380 may be disposed in the external pad bonding area PA. The common source line contact plug 1380 may be formed of a conductive material such as a metal, a metal compound, polysilicon, or the like, and may be electrically connected to the common source line 1320. A first metal layer 1350a and a second metal layer 1360a may be stacked on an upper portion of the common source line contact plug 1380, sequentially. For example, an area in which the common source line contact plug 1380, the first metal layer 1350a, and the second metal layer 1360a are disposed may be defined as the external pad bonding area PA.

Input-output pads 1205 and 1305 may be disposed in the external pad bonding area PA. Referring to FIG. 16, a lower insulating film 1201 covering a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220a, 1220b, and 1220c disposed in the peripheral circuit region PERI through a first input-output contact plug 1203, and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 16, an upper insulating film 1301 covering the upper surface of the second substrate 1310 may be formed on the second substrate 1310, and a second input-output pad 1305 may be disposed on the upper insulating layer 1301. The second input-output pad 1305 may be connected to at least one of the plurality of circuit elements 1220a, 1220b, and 1220c disposed in the peripheral circuit region PERI through a second input-output contact plug 1303. In the example embodiment, the second input-output pad 1305 is electrically connected to a circuit element 1220a.

According to embodiments, the second substrate 1310 and the common source line 1320 may not be disposed in an area in which the second input-output contact plug 1303 is disposed. Also, the second input-output pad 1305 may not overlap the word lines 1330 in the third direction (the Z-axis direction). Referring to FIG. 16, the second input-output contact plug 1303 may be separated from the second substrate 1310 in a direction, parallel to the upper surface of the second substrate 1310, and may pass through the interlayer insulating layer 1315 and the upper insulating film 1301 of the cell region CELL to be connected to the second input-output pad 1305 and an upper metal pattern 1372a of the cell region CELL.

According to embodiments, the first input-output pad 1205 and the second input-output pad 1305 may be selectively formed. For example, the memory device 1400 may include only the first input-output pad 1205 disposed on the lower insulating film 1201 in contact with the first substrate 1210 or the second input-output pad 1305 disposed on the upper insulating film 1301 in contact with the second substrate 1310. Alternatively, the memory device 1400 may include both the first input-output pad 1205 and the second input-output pad 1305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1400 may include a lower metal pattern 1273a, corresponding to an upper metal pattern 1372a formed in an uppermost metal layer of the cell region CELL, and having the same cross-sectional shape as the upper metal pattern 1372a of the cell region CELL so as to be connected to each other, in an uppermost metal layer of the peripheral circuit region PERI. In the peripheral circuit region PERI, the lower metal pattern 1273a formed in the uppermost metal layer of the peripheral circuit region PERI may not be connected to a contact. Similarly, in the external pad bonding area PA, an upper metal pattern 1372a, corresponding to the lower metal pattern 1273a formed in an uppermost metal layer of the peripheral circuit region PERI, and having the same shape as a lower metal pattern 1273a of the peripheral circuit region PERI, may be formed in an uppermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a Cu-to-Cu bonding.

Further, in the bit line bonding area BLBA, an upper metal pattern 1392, corresponding to a lower metal pattern 1252 formed in the uppermost metal layer of the peripheral circuit region PERI, and having the same cross-sectional shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

In example embodiments, the memory device 1400 of FIG. 16 may be one of the memory devices 100, 100a, 100b, 100c, and 200 described with reference to FIGS. 1, 3, 5, 8A to 8D, 11, 12, 13, and 15.

In an embodiment, the memory device 1400 may include the leakage detecting circuit described with reference to FIGS. 1 to 7, 8A to 8D, and 9 to 15 may be formed in the peripheral circuit region PERI and may be configured to detect a leakage current of a plurality of word lines through various metal lines (e.g., driving lines) included in the row decoder 1394 of the peripheral circuit area PERI.

In an embodiment, the cell region CELL of the memory device 1400 may correspond to the memory cell array 110 in FIG. 1 and the memory cell array 210 in FIG. 15. In an embodiment, the peripheral circuit region PERI may correspond to at least one of the row decoder 120, the input/output circuit 140, the control logic circuit 150, the voltage generating circuit 160, and the leakage detecting circuit 170 in FIG. 1.

Figure 17:
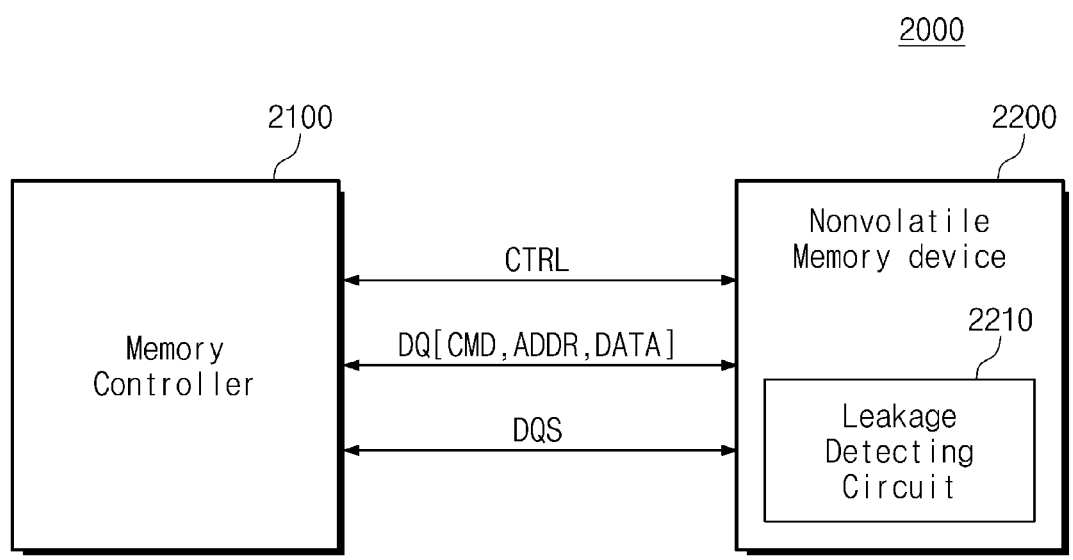
FIG. 17 is a block diagram illustrating a storage device according to example embodiments of the present disclosure.

FIG. 17 is a block diagram illustrating a storage device according to example embodiments of the present disclosure. Referring to FIG. 17, a storage device 2000 may include a memory controller 2100 and a memory device 2200. The memory controller 2100 may store data in the memory device 2200 or may read data stored in the memory device 2200. For example, the memory controller 2100 may send the command CMD and the address ADDR to the memory device 2200, in response to the command CMD and the address ADDR, the memory device 2200 may store the data "DATA" or may output the data "DATA" stored therein.

In an embodiment, the command CMD and the address ADDR may be transferred from the memory controller 2100 to the memory device 2200 through a data line DQ. The memory controller 2100 may separate the command CMD and the address ADDR to be provided through the data line DQ by using various control signals CTRL (e.g., a command latch enable signal CLE, an address latch enable signal ALE, a read enable signals/RE, and a write enable signal/WE). The memory controller 2100 and the memory device 2200 may exchange the data "DATA" through the data line DQ in synchronization with a data strobe signal DQS.

In an embodiment, the memory device 2200 may include a leakage detecting circuit 2210. The leakage detecting circuit 2210 may be configured to detect a leakage current of a target word line based on the operation method described with reference to FIGS. 1 to 7, 8A to 8D, and 9 to 15. In an embodiment, the memory device 2200 may perform the leakage detecting operation in response to an explicit request or an explicit command from the memory controller 2100. Alternatively, the memory device 2200 may perform the leakage detecting operation in a given operation order.

Figure 18:
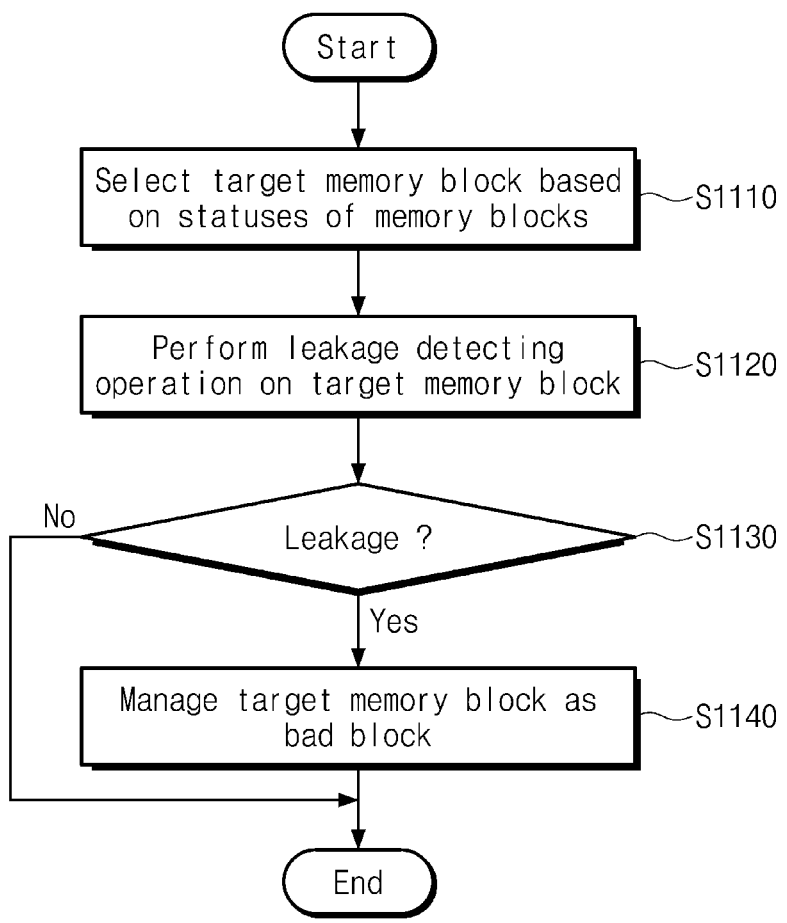
FIG. 18 is a flowchart illustrating an operation of a memory controller of FIG. 17 according to example embodiments.

FIG. 18 is a flowchart illustrating an operation of a memory controller of FIG. 17 according to example embodiments. Referring to FIGS. 17 and 18, in operation S1110, the memory controller 2100 may select a target memory block based on statuses of memory blocks. For example, the memory controller 2100 may manage information about a status (e.g., a P/E cycle) of each of the plurality of memory blocks included in the memory device 2200. The memory controller 2100 may select a memory block, a P/E cycle of which reaches a given reference value, as a target memory block. In an embodiment, the memory controller 2100 may select the target memory block based on various other conditions (e.g., a read count of each memory block, a time passing after each memory block is programmed, or whether an error occurs at each memory block), in addition to the P/E cycle.

In operation S1120, the memory controller 2100 may perform the leakage detecting operation on the target memory block. For example, to perform the leakage detecting operation on the target memory block, the memory controller 2100 may send a leakage detect command to the memory device 2200. In an embodiment, the leakage detect command may be a given command set or may be one of a reserved command, a vendor command, or a combination of various commands. The memory device 2200 may perform the leakage detecting operation on the target memory block in response to the leakage detect command. In an embodiment, the leakage detecting circuit 2210 of the memory device 2200 may perform the leakage detecting operation on the target memory block based on the operation method described with reference to FIGS. 1 to 15.

In operation S1130, the memory controller 2100 may determine whether a leakage current is detected from the target memory block. For example, the memory controller 2100 may receive a result of the leakage detecting operation associated with the target memory block from the memory device 2200. The memory controller 2100 may determine whether a leakage current is detected from the target memory block, based on the result of the leakage detecting operation. In an embodiment, the memory controller 2100 may receive the result of the leakage detecting operation through a status read operation. Alternatively, the memory controller 2100 may receive the result of the leakage detecting operation together with a result of any other operation (e.g., a program operation, a read operation, or an erase operation).

When it is determined that the leakage current is not detected from the target memory block, the memory controller 2100 may not perform a specific operation or may perform a normal operation. When it is determined that the leakage current is detected from the target memory block, in operation S1140, the memory controller 2100 may manage the target memory block as a bad block. For example, the memory controller 2100 may move valid data stored in the target memory block to an arbitrary valid memory block and may manage the target memory block as a bad block.

Figure 19:
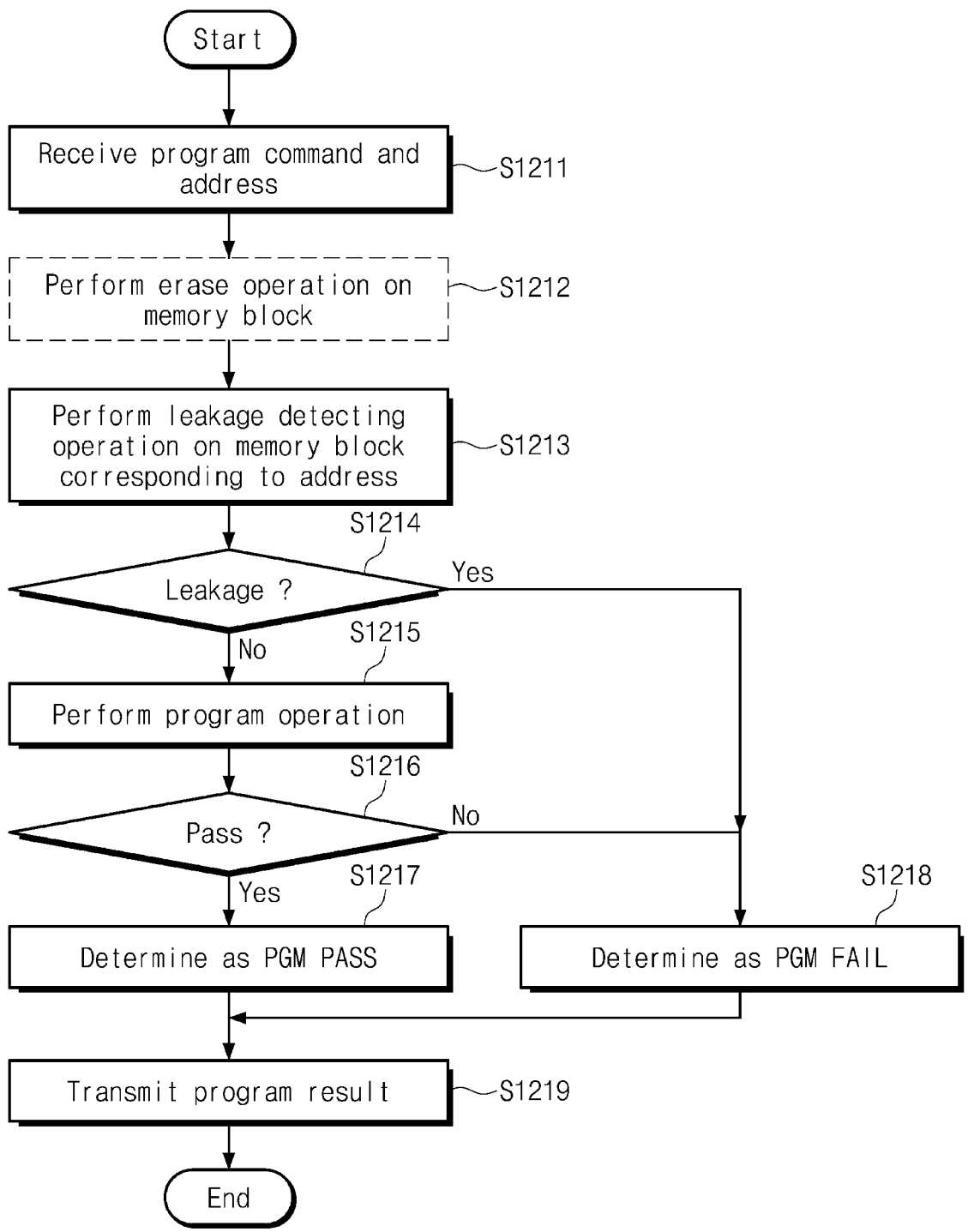
FIG. 19 is a flowchart illustrating an operation of a memory device of FIG. 17 according to example embodiments.

FIG. 19 is a flowchart illustrating an operation of a memory device of FIG. 17 according to example embodiments. Referring to FIGS. 17 and 19, in operation S1211, the memory device 2200 may receive a program command and an address from the memory controller 2100.

In operation S1212, the memory device 2200 may perform the erase operation on a memory block corresponding to the address. In an embodiment, before the memory device 2200 performs the program operation on a memory block, the memory device 2200 may perform the erase operation on the memory block; however, when the memory block does not require the erase operation (e.g., when data are continuously programmed in the memory block), the erase operation associated with the memory block (i.e., operation S1212) may be omitted.

In operation S1213, the memory device 2200 may perform the leakage detecting operation on the memory block corresponding to the address. For example, before the program operation is performed on the memory block corresponding to the address, the leakage detecting circuit 2210 of the memory device 2200 may perform the leakage detecting operation on each word line of the memory block or on a selected word line of the memory block. The leakage detecting operation is similar to that described with reference to FIGS. 1 to 15, and thus, additional description will be omitted to avoid redundancy.

In operation S1214, the memory device 2200 may determine whether a leakage current is detected from the memory block. When it is determined that the leakage current is detected from the memory block, in operation S1218, the memory device 2200 may determine programming of the memory block as a program fail without a separate program operation.

When it is determined that the leakage current is not detected from the memory block, in operation S1215, the memory device 2200 may perform the program operation on the memory block corresponding to the address. In an embodiment, the program operation may be performed based on an incremental step pulse programming (ISPP) manner.

In operation S1216, the memory device 2200 may determine whether the program operation is passed or fails. When it is determined that the program operation is passed, in operation S1217, the memory device 2200 may determine programming of the memory block as program pass. When it is determined that the program operation fails, in operation S1218, the memory device 2200 may determine programming of the memory block as a program fail.

In operation S1219, the memory device 2200 may transmit a program result (e.g., program pass or program fail) to the memory controller 2100.

In an embodiment, when the result of the program operation indicates "program fail", the memory controller 2100 may process the memory block corresponding to the address as a bad block or may perform various reliability management operations on the memory block corresponding to the address.

Figure 20:
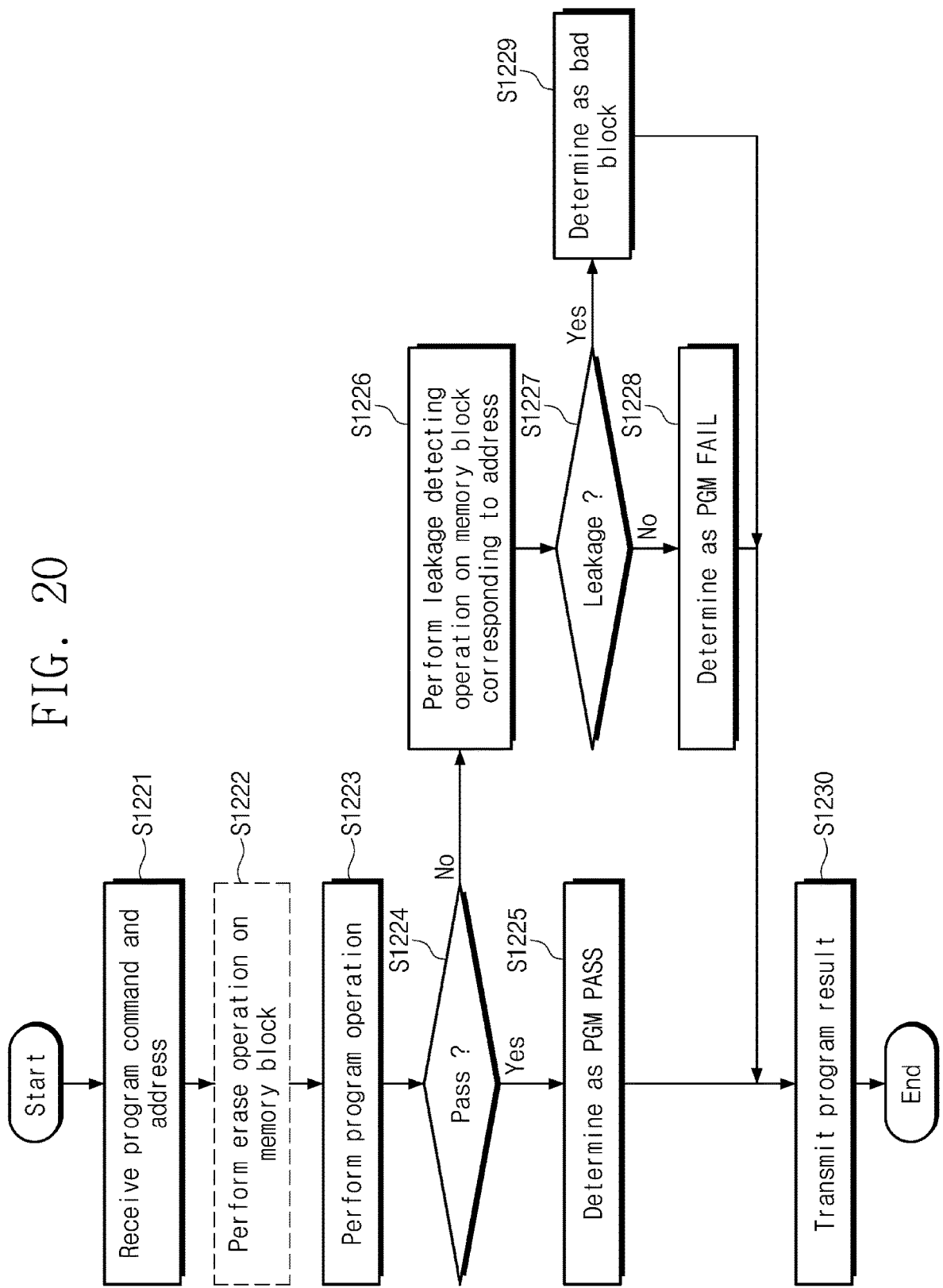
FIG. 20 is a flowchart illustrating an operation of a memory device of FIG. 17 according to example embodiments.

FIG. 20 is a flowchart illustrating an operation of a memory device of FIG. 17 according to example embodiments. Referring to FIGS. 17 and 20, the memory controller 2100 may perform operation S1221 and operation S1222. Operation S1221 and operation S1222 are similar to operation S1211 and operation S1212 of FIG. 19, and thus, additional description will be omitted to avoid redundancy.

In operation S1223, the memory device 2200 may perform the program operation on the memory block. In an embodiment, the program operation may be performed based on an incremental step pulse programming (ISPP) manner.

In operation S1224, the memory device 2200 may determine whether the program operation is passed or fails. When it is determined that the program operation is passed, in operation S1225, the memory device 2200 may determine programming of the memory block as program pass.

When the program operation does not correspond to "program pass", in operation S1226, the memory device 2200 may perform the leakage detecting operation on the memory block corresponding to the address. In an embodiment, the leakage detecting operation may be performed based on the method described with reference to FIGS. 1 to 15.

In operation S1227, the memory device 2200 may determine whether a leakage current is detected. When it is determined that the leakage current is not detected, in operation S1228, the memory device 2200 may determine a result of the program operation as "program fail". When it is determined that the leakage current is detected, in operation S1229, the memory device 2200 may determine the memory block as a bad block. For example, in the case where a leakage current is not detected from a memory block, a program fail may occur due to any other factor. In this case, the memory device 2200 determines the result of the program operation as "simple program fail". In contrast, in the case where the leakage current is detected from the memory block, because the memory block has to be managed as a bad block, the memory device 2200 may determine the memory block as a bad block.

In operation S1230, the memory device 2200 may transmit the result of the program operation to the memory controller 2100.

As described above, the memory device 2200 may selectively perform the leakage detecting operation on the memory block depending on the result of the program operation. In this case, whether the program fail of the memory block comes from a leakage current or comes from any other factor may be determined. Based on the result of the program operation, the memory controller 2100 may process the memory block as a bad block or may perform any other reliability operation.

The embodiments in which the leakage detecting operation of the memory block and the program operation of the memory block are independently performed are described above, but the present disclosure is not limited thereto. For example, the memory device 2200 may perform the program operation based on the ISPP manner. In the first program loop of the ISPP manner or in some program loops of the ISPP manner, the memory device 2200 may perform the leakage detecting operation described with reference to FIGS. 1 to 15, during a word line setup operation, that is, while a pass voltage VPASS is applied to a plurality of word lines of a memory block. That is, the memory device 2200 may perform the leakage detecting operation on a specific word line or a specific word line group at various operation timings.

In an embodiment, while the memory device 2200 performs the above operation (e.g., the leakage detecting operation), a ready/busy signal (RB) that is output from the memory device 2200 may indicate a busy state. That is, in the case where the leakage detecting operation according to the present disclosure is performed, the ready/busy signal may indicate a busy state, and a block selection signal for selecting a target memory block may be activated and deactivated.

Figure 21:
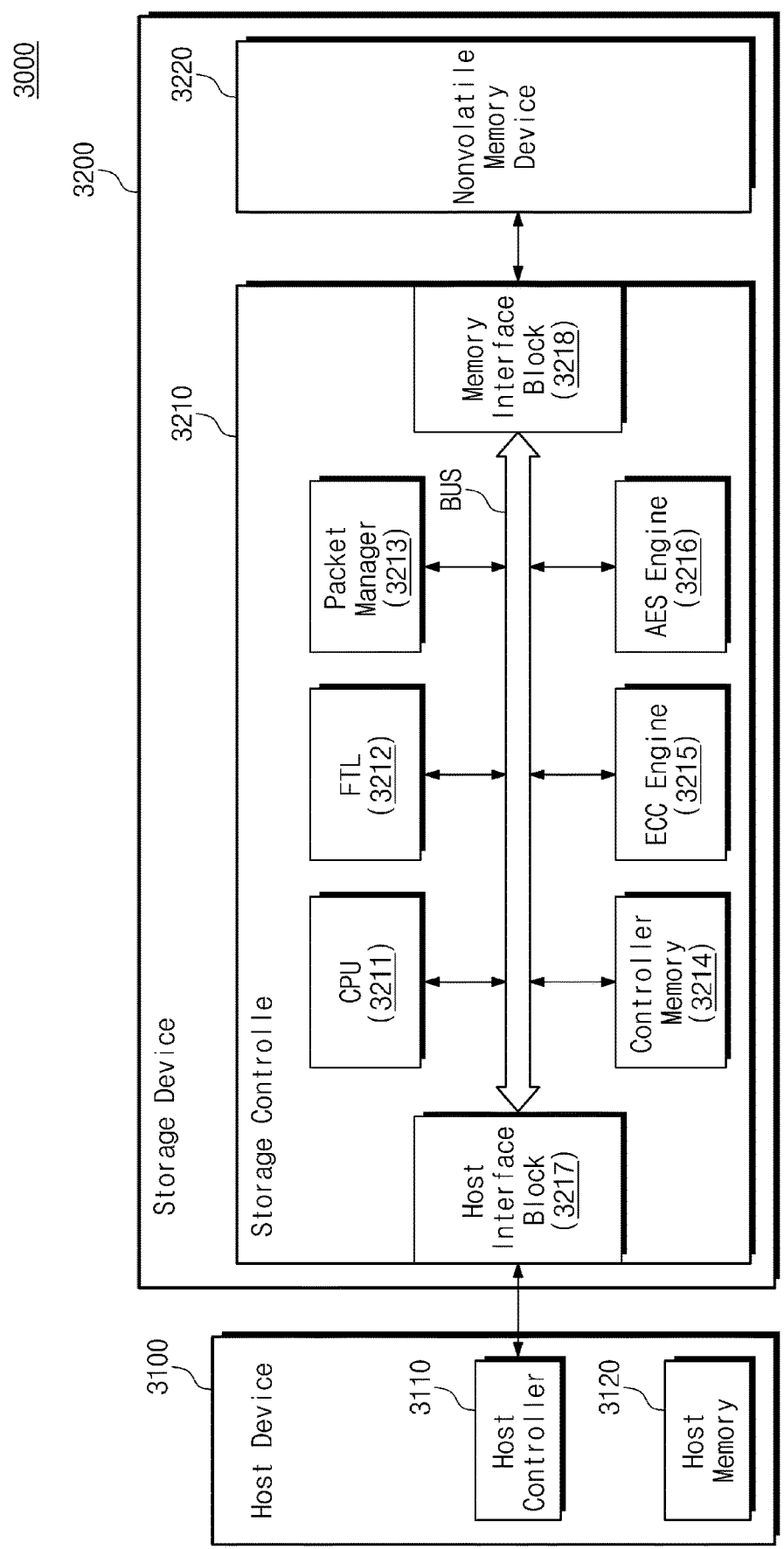
FIG. 21 is a block diagram illustrating a host-storage system according to an embodiment of the present disclosure.

FIG. 21 is a block diagram illustrating a host-storage system according to an embodiment of the present disclosure. Referring to FIG. 21, a host-storage system 3000 may include a host 3100 and a storage device 3200. Also, the storage device 3200 may include a storage controller 3210 and a nonvolatile memory (NVM) 3220. Also, according to an embodiment of the present disclosure, the host 3100 may include a host controller 3110 and a host memory 3120. The host memory 3120 may function as a buffer memory for temporarily storing data to be transmitted to the storage device 3200 or data transmitted from the storage device 3200.

The storage device 3200 may include storage mediums for storing data depending on a request from the host 3100. As an example, the storage device 3200 may include at least one of a solid state drive (SSD), an embedded memory, and a removable external memory. In the case where the storage device 3200 is an SSD, the storage device 3200 may be a device complying with the non-volatile memory express (NVMe) standard. In the case where the storage device 3200 is an embedded memory or an external memory, the storage device 3200 may be a device complying with the universal flash storage (UFS) or embedded multi-media card (eMMC) standard. Each of the host 3100 and the storage device 3200 may generate a packet complying with a standard protocol applied thereto and may transmit the generated packet.

When the nonvolatile memory 3220 of the storage device 3200 includes a flash memory, the flash memory may include a two-dimensional (2D) NAND flash memory array or a three-dimensional (3D) (or vertical) NAND (VNAND) memory array. As another example, the storage device 3200 may be implemented with various kinds of different non-volatile memories. For example, the storage device 3200 may include a magnetic RAM (MRAM), a spin-transfer torque MRAM (STT-MRAM), a conductive bridging RAM (CBRAM), a ferroelectric RAM (FeRAM), a phase change RAM (PRAM), a resistive RAM (RRAM), or at least one of various kinds of different memories. In an embodiment, the nonvolatile memory 3220 may correspond to one of the memory devices 100, 100a, 100b, 100c, 200, 1400 and 2200 described with reference to FIGS. 1, 3, 5, 8A to 8D, 11 to 13 and 15 to 17.

According to an embodiment, the host controller 3110 and the host memory 3120 may be implemented with separate semiconductor chips. Alternatively, in some embodiments, the host controller 3110 and the host memory 3120 may be implemented in the same semiconductor chip. As an example, the host controller 3110 may be one of a plurality of modules included in an application processor; in this case, the application processor may be implemented with a system on chip (SoC). Also, the host memory 3120 may be an embedded memory included in the application processor or may be a nonvolatile memory or a memory module disposed outside the application processor.

The host controller 3110 may manage an operation of storing data (e.g., write data) of a buffer area of the host memory 3120 in the nonvolatile memory 3220 or storing data (e.g., read data) of the nonvolatile memory 3220 in the buffer area.

The storage controller 3210 may include a central processing unit (CPU) 3211, a flash translation layer (FTL) 3212, a packet manager 3213, a controller memory 3214, an error correction code (ECC) engine 3215, an advanced encryption standard (AES) engine 3216, a host interface block 3217, and a memory interface block 3218. The storage controller 3210 may further include a working memory (not illustrated) onto which the flash translation layer 3212 is loaded, and data write and read operations of the nonvolatile memory 3220 may be controlled as the CPU 3211 executes the flash translation layer 3212.

The flash translation layer 3212 may perform various functions such as address mapping, wear-leveling, and garbage collection. The address mapping operation refers to an operation of translating a logical address received from the host 3100 into a physical address to be used to actually store data in the nonvolatile memory 3220. The wear-leveling that is a technology for allowing blocks in the nonvolatile memory 3220 to be used uniformly such that excessive degradation of a specific block is prevented may be implemented, for example, through a firmware technology for balancing erase counts of physical blocks. The garbage collection refers to a technology for securing an available capacity of the nonvolatile memory 3220 through a way to erase an existing block after copying valid data of the existing block to a new block.

The packet manager 3213 may generate a packet complying with a protocol of an interface agreed with the host 3100 or may parse various kinds of information from the packet received from the host 3100. Also, the controller memory 3214 may temporarily store data to be written in the nonvolatile memory 3220 or data read from the nonvolatile memory 3220. The controller memory 3214 may be a component provided within the storage controller 3210; however, it may be possible to dispose the controller memory 3214 outside the storage controller 3210.

The ECC engine 3215 may perform an error detection and correction function on data read from the nonvolatile memory 3220. In more detail, the ECC engine 3215 may generate parity bits for write data to be written in the nonvolatile memory 3220, and the parity bits thus generated may be stored in the nonvolatile memory 3220 together with the write data. When data are read from the nonvolatile memory 3220, the ECC engine 3215 may correct an error of the read data by using parity bits read from the nonvolatile memory 3220 together with the read data and may output the error-corrected read data.

The AES engine 3216 may perform at least one of an encryption operation and a decryption operation on data input to the storage controller 3210 by using a symmetric-key algorithm.

The host interface block 3217 may exchange packets with the host 3100. The packet that is transmitted from the host 3100 to the host interface block 3217 may include a command or data to be written in the nonvolatile memory 3220, and the packet that is transmitted from the host interface block 3217 to the host 3100 may include a response to the command or data read from the nonvolatile memory 3220. The memory interface circuit 3218 may provide the nonvolatile memory 3220 with data to be written in the nonvolatile memory 3220, and may receive data read from the nonvolatile memory 3220. The memory interface block 3218 may be implemented to comply with the standard such as Toggle or ONFI (Open NAND Flash Interface).

In an embodiment, the storage controller 3210 may be configured to detect a leakage current occurring at the nonvolatile memory 3220, like the memory controller 2100 described above. The nonvolatile memory 3220 may include a leakage detecting circuit configured to perform the leakage detecting operation under control of the storage controller 3210.

According to the present disclosure, a memory device may accurately detect a leakage current of each of a plurality of word lines. Accordingly, a memory device with improved reliability and improved lifetime and an operation method thereof are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operation method of a memory device including a leakage detecting circuit and a row decoder configured to control a voltage of a first word line through a first driving line, the method comprising:
    floating the first driving line from the first word line and precharging the first driving line with a first voltage;
    floating the first driving line from the first voltage to sense a first voltage variation of the first driving line;
    storing the first voltage variation in a first capacitor of the leakage detecting circuit;
    electrically connecting the first driving line to the first word line and precharging the first driving line and the first word line with the first voltage;
    floating the first driving line and the first word line from the first voltage to sense a second voltage variation of the first driving line and the first word line; and
    outputting, by the leakage detecting circuit, a first detection signal corresponding to a first leakage current through the first word line based on the first voltage variation stored in the first capacitor and the second voltage variation.

2. The method of claim 1, wherein the first voltage variation is a magnitude corresponding to a second leakage current through the first driving line other than the first word line, and
    wherein the second voltage variation is a magnitude corresponding to a sum of the second leakage current and the first leakage current.

3. The method of claim 1, wherein the memory device further includes a first block selecting circuit connected between the first word line and the first driving line,
    wherein the floating of the first driving line from the first word line and the precharging of the first driving line with the first voltage, and the floating of the first driving line from the first voltage to sense the first voltage variation of the first driving line, each includes turning off the first block selecting circuit, and
    wherein the storing of the first voltage variation in the first capacitor, the precharging of the first driving line and the first word line with the first voltage, and the floating of the first driving line and the first word line from the first voltage to sense the second voltage variation of the first driving line and the first word line, each includes turning on the first block selecting circuit.

4. The method of claim 1, further comprising:
    when the first detection signal is not output, performing a program operation on the first word line; and
    when the first detection signal is output, determining the program operation of the first word line as a program fail.

5. The method of claim 1, wherein a first time period during which the first voltage variation of the first driving line is sensed, and a second time period during which the second voltage variation of the first driving line and the first word line is sensed, have a given ratio.

6. A memory device comprising:
    a first memory block connected to a first word line;
    a row decoder configured to control a voltage of the first word line through a first driving line; and
    a leakage detecting circuit configured to output a first detection signal by:
    detecting a first leakage current through the first driving line other than the first word line during a first time interval,
    storing a first voltage corresponding to the first leakage current during a second time interval,
    detecting a second leakage current through the first driving line during a third time interval, and
    detecting a third leakage current through the first word line based on the first voltage and the second leakage current.

7. The memory device of claim 6, wherein the row decoder includes:
a first block selecting circuit configured to electrically connect the first driving line to the first word line in response to a first block selection signal; and
a driving line driver configured to drive the first driving line in response to a first driving line control signal.

8. The memory device of claim 7, wherein, during the first time interval, the first block selecting circuit is configured to float the first driving line from the first word line, and the driving line driver is configured to float the first driving line from a second voltage,
wherein, during the second time interval, the first block selecting circuit is configured to electrically connect the first driving line to the first word line, and the driving line driver is configured to precharge the first driving line with the second voltage, and
wherein, during the third time interval, the first block selecting circuit is configured to electrically connect the first driving line to the first word line, and the driving line driver is configured to float the first driving line from the second voltage.

9. The memory device of claim 8, wherein the leakage detecting circuit includes:
a driving line selector configured to select the first driving line in response to a first driving line selection signal;
a first capacitor connected between a comparison node and a ground node;
a second capacitor connected between an output node of the driving line selector and the comparison node;
a first transistor connected between the comparison node and an input voltage, and configured to operate in response to a switching signal; and
a first comparator configured to compare a comparison voltage of the comparison node and a first reference voltage and to output a result of the comparison as the first detection signal.

10. The memory device of claim 9, wherein, during the first time interval, the driving line selector is configured to select the first driving line, and the first transistor is configured to turn on, and
wherein, during the second time interval and the third time interval, the driving line selector is configured to select the first driving line, and the first transistor is configured to turn off.

11. The memory device of claim 10, wherein, during the first time interval, a voltage between the second capacitor and the driving line selector decreases from the second voltage as much as a first voltage variation,
wherein, during the second time interval, the voltage between the second capacitor and the driving line selector increases to the second voltage, and the comparison voltage increases from the input voltage as much as a second voltage variation corresponding to the first voltage variation, and
wherein, during the third time interval, the voltage between the second capacitor and the driving line selector decreases from the second voltage as much as a third voltage variation, and the comparison voltage decreases as much as a fourth voltage variation corresponding to the third voltage variation.

12. The memory device of claim 11, wherein a difference between the fourth voltage variation and the second voltage variation corresponds to the third leakage current.

13. The memory device of claim 9, wherein a time length of the first time interval and a time length of the third time interval have a given ratio.

14. The memory device of claim 9, wherein the leakage detecting circuit further includes:
a second comparator configured to compare the comparison voltage of the comparison node and a second reference voltage and to output a result of the comparison as a second detection signal, and
wherein the first detection signal is a signal corresponding to the third leakage current, and the second detection signal is a signal corresponding to the first leakage current.

15. The memory device of claim 7, further comprising:
a second memory block connected to a second word line,
wherein the row decoder further includes:
a second block selecting circuit configured to electrically connect the first driving line to the second word line in response to a second block selection signal.

16. The memory device of claim 15, wherein the row decoder further includes:
a driving line switch connected between a first node and a second node, and configured to operate in response to a path switching signal,
wherein the first node is a node at which the first driving line and the first block selecting circuit are connected, and the second node is a node at which the first driving line and the second block selecting circuit are connected.

17. An operation method of a memory device including a plurality of memory blocks and a leakage detecting circuit configured to detect a leakage current, the method comprising:
precharging a first current path with a first voltage;
floating the first current path from the first voltage to detect a first voltage variation corresponding to a first leakage current on the first current path;
storing the first voltage variation in a first capacitor of the leakage detecting circuit;
precharging the first current path and a second current path with the first voltage;
floating the first current path and the second current path from the first voltage to detect a second voltage variation corresponding to a sum of the first leakage current on the first current path and a second leakage current on the second current path; and
outputting, by the leakage detecting circuit, a first detection signal corresponding to the second leakage current based on the first voltage variation stored in the first capacitor and the second voltage variation,
wherein the leakage current includes the first leakage current and the second leakage current.

18. The method of claim 17, wherein the first current path includes a first driving line other than and corresponding to a first word line connected to a first memory block of the plurality of memory blocks, and
wherein the second current path includes the first word line.

19. The method of claim 17, wherein the first current path includes a first portion of a first driving line corresponding to a first word line connected to a first memory block of the plurality of memory blocks, and
wherein the second current path includes a second portion of the first driving line other than the first portion.

20. The method of claim 17, wherein the first current path includes a first driving line other than a plurality of word lines, and wherein the second current path includes at least two word lines corresponding to the first driving line from among the plurality of word lines of each of the plurality of memory blocks.

\* \* \* \* \*